(12) United States Patent
Yamashita et al.

(10) Patent No.: US 6,995,397 B2
(45) Date of Patent: Feb. 7, 2006

(54) SEMICONDUCTOR DEVICE

(75) Inventors: Kenya Yamashita, Kadoma (JP); Makoto Kitabatake, Nara (JP); Osamu Kusumoto, Nara (JP); Kunimasa Takahashi, Ibaraki (JP); Masao Uchida, Ibaraki (JP); Ryoko Miyanaga, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 88 days.

(21) Appl. No.: 10/466,353

(22) PCT Filed: Sep. 17, 2002

(86) PCT No.: PCT/JP02/09491

§ 371 (c)(1),
(2), (4) Date: Jul. 14, 2003

(87) PCT Pub. No.: WO03/028110

PCT Pub. Date: Apr. 3, 2003

(65) Prior Publication Data

US 2004/0051104 A1    Mar. 18, 2004

(30) Foreign Application Priority Data

Sep. 14, 2001  (JP)  .............................. 2001-278996

(51) Int. Cl.
*H01L 31/072*    (2006.01)

(52) U.S. Cl. .......................... 257/77; 257/192; 257/194

(58) Field of Classification Search .................. 257/77, 257/345, 372, 402–404
See application file for complete search history.

(56) References Cited

U.S. PATENT DOCUMENTS

| | | | |
|---|---|---|---|
| 6,228,725 B1 * | 5/2001 | Nandakumar et al. | 438/289 |
| 6,455,892 B1 * | 9/2002 | Okuno et al. | 257/328 |
| 6,784,492 B1 * | 8/2004 | Morishita | 257/347 |
| 2004/0238883 A1 * | 12/2004 | Nishinohara et al. | 257/330 |

FOREIGN PATENT DOCUMENTS

| | | |
|---|---|---|
| EP | 921575 | 6/1999 |
| JP | 2000-150866 | 5/2000 |
| JP | P2000-340512 A | 12/2000 |
| JP | 2001-102582 | 4/2001 |
| JP | 2001-196604 | * 7/2001 |
| JP | 2003-318397 | * 11/2003 |
| WO | WO 01/93339 | 12/2001 |

OTHER PUBLICATIONS

Linewih, Handoko et al., Novel SIC Accumulation-Mode Power MOSFET. In: IEEE Transactions on Electron Devices, 2001. 08, vol. 48, No. 8, pp. 1711 to 1717, pp. 1711 to 1712, II. Device Structure and Operation.

Chen Q. et al., Fabrication, performance and characterization of SI delta-doped FET grown by MBE In: High Speed Semiconductor Devices and Circuits, 1993. Proceedings., IEEE/Cornell Conference on Advanced Concepts In, Aug. 02, 1993, pp. 228 to 235; p. 229, line 4 to p. 230, line 25.

* cited by examiner

Primary Examiner—Nathan J. Flynn
Assistant Examiner—Ahmad N. Sefer
(74) Attorney, Agent, or Firm—McDermott Will & Emery LLP

(57) ABSTRACT

A semiconductor device having an accumulation channel SiC-MISFET structure includes a p-type SiC layer 10 formed on an SiC substrate, an n-type channel layer 20, a gate insulating film 11, a gate electrode 12, and n-type source and drain layers 13a and 13b. The channel layer 20 includes an undoped layer 22 and a δ doped layer 21 which is formed in the vicinity of the lower end of the undoped layer 22. Since the channel layer 20 includes the high-concentration δ doped layer 21 in its deeper portion, the electric field in the surface region of the channel layer is weakened, thereby allowing the current driving force to increase.

26 Claims, 14 Drawing Sheets

| | Inversion | Accumulation | DAC1 | DAC2 | DAC3 | DAC4 | DAC5 |
|---|---|---|---|---|---|---|---|
| Vt(V) | 2.7 | 0.8 | 0.5 | −2.0 | −4.3 | −6.4 | −8 |

SEMICONDUCTOR DEVICE

TECHNICAL FIELD

The present invention relates to semiconductor devices having an accumulation channel MISFET structure, and more particularly relates to measures to obtain normally-off operation in power devices.

BACKGROUND ART

Since silicon carbide (hereinafter referred to as "SiC") has a wide bandgap and high dielectric breakdown characteristics as compared with other semiconductor materials, applications in low-loss power devices are being anticipated. On an SiC layer, a relatively high quality silicon dioxide ($SiO_2$) film is formed by thermal oxidation of the SiC. It is therefore presumably effective to adopt an insulated-gate structure for an SiC power conversion device.

Nevertheless, a thermal oxide film, as a gate insulating film, formed on an SiC layer has many problems remaining to be overcome. For example, defects in a thermal oxide film cause high-density interface traps to be present in a region of the SiC layer in the vicinity of the interface with the insulating film, which have a profound effect on the electron-transport mechanism in the MIS channel. Specifically, the interface traps existing in the region of the SiC layer in the vicinity of the interface with the insulating film cause significantly reduced channel conductance in the insulated-gate SiC device. However, the mechanism in which defects in a thermal oxide film cause interface traps to form in a region of the SiC layer in the vicinity of the thermal oxide film has hardly been studied so far.

In particular, in an interface of $SiO_2/SiC$ in which 4H—SiC is used, acceptor traps, called $E'_1$ centers, are created, due to defects in the oxide film, in the forbidden-band location having potential in the vicinity of the conduction band, and the acceptor traps significantly affect transportation of electrons. 4H—SiC, having a wider bandgap, a higher dielectric breakdown voltage, and a higher bulk mobility than other poly-type crystals such as a 6H—SiC crystal, is a poly type of crystal best suited to be applied in power devices. Due to the above-mentioned acceptor traps, however, a MISFET including an SiC layer of a 4H—SiC crystal has an extremely low channel mobility, which is a major obstacle in practical applications of the SiC device.

As mentioned above, since in inversion MISFETs in which 4H—SiC is used, interface traps affect the electron transport mechanism seriously, various studies have been made in order to increase the channel mobility of the MISFETs. Particularly, in research on accumulation channel MISFETs, raising channel mobility up to twice that of inversion MISFETs has been successfully achieved. In this case, the essential significance of the accumulation channel MISFETs is in their structure in which, in the depth-direction density distribution of current flowing in the channel, the ratio of the current flowing in the deeper portion of the channel region to the current flowing in the surface portion thereof, is increased as compared with the ratio in the inversion MISFETs.

PROBLEMS THAT THE INVENTION INTENDS TO SOLVE

However, despite having relatively higher carrier mobility, conventional ACCUFETs and other accumulation channel MISFETs have not yet had such current density as necessary for a power device probably because they cannot have sufficiently high channel mobility due to the effects of interface traps present at the MOS interface.

In an accumulation channel MISFET, however, if the ratio of the current flowing in the deeper portion of the channel region to the current flowing in the surface portion thereof is too high, the MISFET is likely to have a so-called normally-on structure in which current flows with no gate bias applied, which is undesirable from the viewpoint of fail-safe of equipment in which such a power transistor is applied.

DISCLOSURE OF INVENTION

It is therefore an object of the present invention to take measures to effectively increase mobility of current flowing in a channel region in an accumulation channel MISFET structure, thereby realizing a semiconductor device that functions as a power device in which a wide bandgap semiconductor such as SiC is used.

A first inventive semiconductor device includes: a semiconductor substrate; a semiconductor region of a first conductivity type formed in at least a part of the semiconductor substrate; a modulation-doped channel layer formed on the first-conductivity-type semiconductor region, having a non-uniform impurity concentration distribution, and being of a second conductivity type on average; a gate insulating film formed on the channel layer; a gate electrode formed on the gate insulating film; and a source layer of the second conductivity type formed in the first-conductivity-type semiconductor region so as to be located laterally with respect to the gate electrode; wherein given that y is depth into the channel layer from the surface thereof; N(y), a function of the depth y, is the impurity concentration of the channel layer in the depth direction; $N_{cm}$ is the average impurity concentration of the channel layer; and yc, which is the depth of the center of gravity of the impurity concentration distribution in the depth direction in the channel layer, is given by the following equation:

$$yc = |\{\int N(y) \cdot y \cdot dy\}/N_{cm}|,$$

then the channel layer is configured to satisfy the following equation:

$$yc \geq T_{ch}/2$$

where $T_{ch}$ is the thickness of the entire channel layer.

Then, in the channel layer, the electric field applied in the deeper portion is relatively large and the electric field applied in the surface portion is relatively slight, allowing the carrier mobility in the surface portion to increase. Consequently, with adverse effects of the gate insulating film being suppressed, channel resistance is reduced and a large amount of current is obtained, such that a semiconductor device with high current driving force can be obtained.

When the semiconductor substrate is an SiC substrate, the wide bandgap characteristics of the SiC are utilized, such that a semiconductor device with excellent performance as a power transistor can be obtained.

The channel layer is preferably configured to be pinched off by a depletion layer that extends from the gate insulating film and a depletion layer that extends from the first-conductivity-type semiconductor region when the potential of the gate electrode is about 0 V.

The thickness $T_{ch}$ of the channel layer preferably satisfies the following equation:

$$T_{ch} \leq \sqrt{[(2\varepsilon s/q)\{(N_{cm}+N_{bs})/(N_{cm}\cdot N_{bs})\}\cdot V_{bl}]} + \sqrt{[(2\varepsilon s/q)(1/N_{cm})\{\phi_{ms}-(Q/C_{ox})\}]}$$

where $|N_{bs}|$ is the absolute value of first-conductivity-type impurity concentration of the first-conductivity-type semiconductor region; $|N_{cm}|$ is the absolute value of the average impurity concentration of the channel layer; $\varepsilon$s is the vacuum dielectric constant; q is the elementary charge; $N_{bs}$ is the impurity concentration of the base layer; $\phi_{ms}$ is the surface potential of the channel layer; Q is electric charge in the gate insulating film; $C_{ox}$ is the capacitance of the gate insulating film; and $V_{bl}$ is difference in internal potential between the channel portion and the base portion.

Since the average impurity concentration $T_{ch}$ or thickness $N_{cm}$ of the channel layer is one of the important parameters in designing a normally-off power transistor, the electric characteristics that depend upon the structure of the channel layer can be roughly estimated from the average impurity concentration and thickness of the channel layer and the impurity concentration of the base region. After $N_{cm}$ and $N_{bs}$ are determined, $T_{ch}$ is calculated by the above equation. If the thickness of the channel layer is made not more than $T_{ch}$, the depletion layer that extends from the first-conductivity-type semiconductor region (base) side and the depletion layer that extends from the gate electrode side cause pinch-off in the channel layer, thereby obtaining a structure that can realize a normally-off device.

When the absolute value $|N_{bs}|$ of the first-conductivity-type impurity concentration of the first-conductivity-type semiconductor region is higher than the absolute value $|N_{cm}|$ of the average second-conductivity-type impurity concentration of the channel layer, the leakage current produced when the gate is off can be reduced.

When the channel layer includes a high-concentration doped layer and a low-concentration doped layer, wherein the high-concentration doped layer contains an impurity of the second conductivity type, and the low-concentration doped layer is of the second conductivity type and has an impurity concentration not more than one-tenth of the peak concentration of the high-concentration doped layer, an optimum channel structure can be realized in an easy manner.

When the high-concentration doped layer is a δ doped layer formed below a mid-position of the channel layer, the center of gravity of the impurity concentration distribution in the channel layer can be easily adjusted to be located in a deeper portion. Further, the δ doped layer is located in a deep portion close to the first-conductivity-type semiconductor region, and the electric field applied in the vicinity of the δ doped layer is high. This makes it easy to keep the location of the pinch-off point as deep as possible in the channel layer, thereby suppressing the electric field effected near the surface layer of the channel layer.

The thickness of the δ doped layer is preferably not more than 10 nm. Such a structure can be easily realized by pulse-doping of an impurity using a pulse valve.

The first-conductivity-type impurity concentration of the first-conductivity-type semiconductor region is preferably high to a degree at which the δ doped layer is depleted to a foot area of its concentration profile which has a low impurity concentration and is located alongside the gate electrode.

When the distance from an edge of the δ doped layer, which is located alongside the first-conductivity-type semiconductor region, to the first-conductivity-type semiconductor region is 20 nm or less, a situation in which the depletion of the δ doped layer becomes difficult is avoided, such that leakage current can be suppressed.

When a voltage of about 0 V is applied to the gate electrode, the depletion layer that extends from the gate electrode side and the depletion layer that extends from the first-conductivity-type semiconductor region preferably make contact with each other in a foot area of a concentration profile for the δ doped layer, such that pinch-off is caused in the channel layer. The foot area has a low impurity concentration and is located alongside the gate electrode.

Specifically, when the impurity concentration of the foot area, being the pinch-off point, is not less than the impurity concentration of the low-concentration doped layer and not more than the peak concentration of the δ doped layer, the semiconductor device operates stably and its reliability is enhanced.

In the transistor designed in the above manner, the depletion layer that extends from the first-conductivity-type semiconductor region side is stable and hardly changes even when the voltage applied to the gate electrode is varied. Further, when a voltage from about 0 V going to where the channel goes on is applied to the gate electrode, opening of the channel takes place in such a manner that the depletion layer that extends from the first-conductivity-type semiconductor region begins to expand from the foot area, being the pinch-off point, of the δ doped layer so as to extend to the interface between the channel layer and the gate insulating film. This allows the current to start flowing from the interior portion of the channel which has a low resistance, and even when the depletion layer has reached the gate insulating film, most part of the current continues to flow substantially uniformly in the channel interior portion and is not likely to be affected by interface traps present at the surface of the channel layer, for example. In addition, since the depletion layer extends smoothly to the gate insulating film, no kink is created in the Id-Vg characteristics, thereby also achieving optimum performance in the channel resistance.

The high-concentration doped layer may be a deep-portion δ doped layer formed below a mid-position of the channel layer, and the semiconductor device may further include a surface-portion δ doped layer formed above the mid-portion of the channel layer. In this case, carriers can be supplied to the channel layer from the surface-portion δ doped layer, which allows the current driving force to increase.

The impurity concentration of the surface-portion δ doped layer is preferably lower than that of the deep-portion δ doped layer.

The high-concentration doped layer may be a graded doped layer in which impurity concentration decreases going from its lower part to its upper part. Also in this case, the electric field applied in the deeper portion of the channel layer is strong, while the applied electric field in the surface portion is relatively weak. Thus, substantially the same effects as obtained when the δ doped layer is formed in the deeper portion of the channel layer are exhibited.

When a voltage of about 0 V is applied to the gate electrode, the depletion layer that extends from the gate electrode side and the depletion layer that extends from the first-conductivity-type semiconductor region preferably make contact with each other in a graded region of an impurity concentration profile for the graded doped layer, such that pinch-off is caused in the channel layer.

The high-concentration doped layer may be a uniformly doped layer that is formed in contact with the first-conductivity-type semiconductor region and has a substantially uniform impurity concentration.

The uniformly doped layer may function to stop the depletion layer that extends from the first-conductivity-type semiconductor region so that the pinch-off point is stabilized in a substantially constant location.

The impurity concentration of the uniformly doped layer is preferably not less than that of the first-conductivity-type semiconductor region.

When the thickness $T_{ds}$ of the uniformly doped layer satisfies the following equation:

$$T_{ds} \geq \{N_{bs}/(N_s+N_{bs})\} \times \sqrt{[(2\varepsilon s/q) \cdot \{(N_s+N_{bs})/(N_s \cdot N_{bs})\} \cdot V_{bi}]}$$

where $N_s$ is the impurity concentration of the uniformly doped layer, it is ensured that the uniformly doped layer functions as a depletion layer stopper.

Where $N_{ud}$ is the impurity concentration of the low-concentration doped layer in the channel layer, the thickness $T_{ud}$ of the low-concentration doped layer preferably satisfies the following equation:

$$T_{ud} \leq \sqrt{[(2\varepsilon s/q)(1/N_{ud})\{\phi_{ms}-(Q/C_{ox})\}]}.$$

In view of the above, the thickness $T_{ud}+T_{ds}$ of the entire channel layer preferably satisfies the following equation:

$$T_{ud}+T_{ds} \leq \sqrt{[(2\varepsilon s/q) \cdot \{(N_s+N_{bs})/(N_s \cdot N_{bs})\} \cdot V_{bi}]} + \sqrt{[(2\varepsilon s/q)(1/(N_{ud})\{\phi_{ms}-(Q/C_{ox})\}]}.$$

When a voltage of about 0 is applied to the gate electrode, if the depletion layer that extends from the gate insulating film side and the depletion layer that extends from the first-conductivity-type semiconductor region side come into contact with each other and cause pinch-off in an impurity-concentration-profile region of transition from the uniformly doped layer to the low-concentration doped layer, the pinch-off point is stably located in the deeper portion of the channel layer.

Where Vg is a voltage applied to the gate electrode, Vt is the threshold voltage, and the absolute value of Vg−Vt is within a range of not less than 0 V and not more than 5 V, if current flowing in a region of the channel layer which is located below the mid-position thereof is larger than current flowing in a region of the channel layer which is located above the mid- position, then a high current driving force is achieved.

The semiconductor device may further include a drain layer formed by doping a lower portion of the semiconductor substrate with a high concentration of an impurity of the second conductivity type, and may function as a vertical MISFET.

A second inventive semiconductor device includes at least: a semiconductor substrate; a semiconductor region of a first conductivity type formed in at least a part of the semiconductor substrate; a modulation-doped channel layer formed on the first-conductivity-type semiconductor region, having a non-uniform impurity concentration distribution, and being of a second conductivity type on average; a gate insulating film formed on the channel layer; a gate electrode formed on the gate insulating film; and a source layer of the second conductivity type formed in the first-conductivity-type semiconductor region so as to be located laterally with respect to the gate electrode; wherein the concentration of an impurity of the first conductivity type in the first-conductivity-type semiconductor region is higher than the absolute value of the average second-conductivity-type impurity concentration of the channel layer; and the channel layer is structured in such a manner that when the channel layer is in its on state with a voltage larger than its threshold voltage being applied to the gate electrode, the ratio between average current density in a surface layer that is a region located from the surface of the channel layer to a given depth and average current density in a deeper portion that is a region of the channel layer located at a depth beyond the given depth is lower than the ratio thereof obtained where the channel layer is replaced by a second-conductivity-type semiconductor layer having a uniform-concentration.

Then, when the semiconductor device is in its on state, in the current flowing in the modulation-doped channel layer, the proportion of the current flowing in the deeper portion thereof increases, such that effects of interface traps, for example, on the carriers flowing in the channel are weakened, thereby realizing a high mobility.

When the semiconductor substrate is an SiC substrate, the given depth is about 5 nm.

When the channel layer is formed by alternately stacking at least a high-concentration layer and a low-concentration layer whose impurity concentration is not more than one-tenth of the impurity concentration of the high-concentration layer, effects of interface traps can be particularly effectively avoided.

Given that m (m is an integer) is the number of repetitions of the high-concentration layer and the low-concentration doped layer, Ls is the thickness of the low-concentration doped layer, Nn$^-$ is the impurity concentration of the low-concentration doped layer, L $\delta$ is the thickness of the high-concentration layer, and Nn$^+$ is the impurity concentration of the high-concentration layer, if the following equation:

$$(Ls \times Nn^- + L\delta \times Nn^+ \times m)/(Ls+L\delta \times m) \leq Np^+$$

holds, it is ensured that normally-off operation is realized in the semiconductor device.

When the semiconductor substrate is an SiC silicon substrate, the particularly wide bandgap thereof is utilized to obtain a semiconductor device structure suitable for a power device.

BEST MODE FOR CARRYING OUT THE INVENTION

First Embodiment

Figure 1:
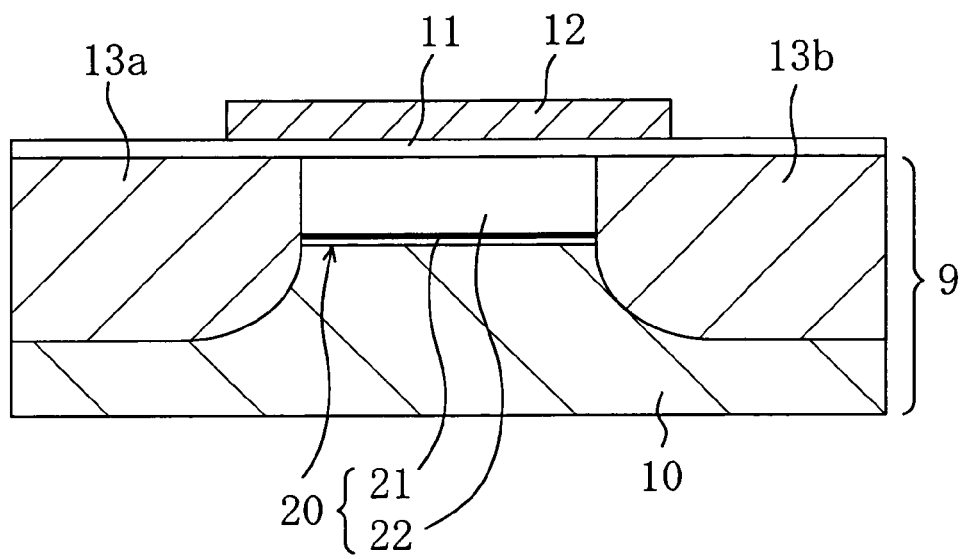
FIG. 1 is a cross sectional view illustrating the basic structure of a semiconductor device in accordance with a first embodiment of the present invention.

FIG. 1 is a cross sectional view illustrating the basic structure of a semiconductor device (SiC-MISFET (d-DACFET)) in accordance with a first embodiment of the present invention.

As shown in FIG. 1, the SiC-MISFET of this embodiment includes an epitaxial SiC layer 9 formed by epitaxial growth on an SiC substrate (not shown) having a 4H—SiC structure. The epitaxial SiC layer 9 includes a p-type SiC layer 10, an n-type channel layer 20, a gate insulating film 11, a gate electrode 12, an n-type source layer 13a, and an n-type drain layer 13b. The p-type SiC layer 10 is a base region. The n-type channel layer 20 is formed on the p-type SiC layer 10 and modulation-doped by in-situ doping. The gate insulating film 11 is formed on the channel layer 20 by thermal oxidation. The gate electrode 12 is formed on the gate insulating film 11. The respective n-type source and drain layers 13a and 13b are formed by implanting an n-type impurity into regions in the channel layer 20 and SiC layer 10 located on either side of the gate electrode 12.

The channel layer 20 includes an n-type undoped layer 22 (low-concentration doped layer) and an n-type δ doped layer 21 (high-concentration doped layer). The undoped layer 22 has an impurity concentration of about $1.\times10^{16}\cdot cm^{-3}$ and a thickness of about 200 nm. The δ doped layer 21, interposed in the undoped layer 22, has an impurity concentration of about $3.2\times10^{18}\cdot cm^{-3}$ and a thickness of about 10 nm. The lower surface of the δ doped layer 21 and the upper surface of the p-type SiC layer 10 (that is, the junction plane between the p-type SiC layer 10 and the channel layer 20) are spaced apart from each other by only 10 nm. The n-type source and drain layers 13a and 13b each have an impurity concentration of about $1.\times10^{20}\cdot cm^{-3}$ and a thickness of about 350 nm. The p-type impurity concentration of the p-type SiC layer 10 is about $5.\times10^{17}\cdot cm^{-3}$. The channel layer 20 in the SiC-MISFET of this embodiment has an average impurity concentration of about $2.\times10^{17}\cdot cm^{3}$ and a thickness of 200 nm.

Such a structure can be easily obtained by pulse-doping of impurities using a pulse valve, as disclosed in Japanese Laid-Open Pat. Publication No. 2000-340512 filed by the present applicant.

Specifically, the SiC-MISFET of this embodiment has an accumulation channel MISFET structure that includes the n-type source and drain layers 13a and 13b, the p-type SiC layer 10 that is the p-type base region doped to the substantially uniform concentration, and the modulation-doped n-type channel layer 20. The SiC-MISFET also includes the high-concentration δ doped layer 21 in a deep region of the channel layer 20. The SiC-MISFET of this embodiment will thus be simply referred to as a "d-DACFET".

In the d-DACFET of this embodiment, where y is depth into the channel layer 20 from the surface thereof N(y), a function of the depth y, is the impurity concentration of the channel layer 20 in the depth direction, and $N_{cm}$ is the average impurity concentration of the channel layer 20, the depth yc of the center of gravity of the depth-direction distribution of the impurity concentration is given by the following equation (1).

$$yc=|\{\int N(y)\cdot y\cdot dy\}/N_{cm}| \quad (1)$$

In this case, where $T_{ch}$ is the thickness of the entire channel layer, the channel layer is formed to satisfy the following equation (2).

$$yc \leq T_{ch}/2 \quad (2)$$

Further, given that ∈s is the vacuum dielectric constant; q is the elementary charge; $N_{bs}$ is the impurity concentration of the base layer; $\phi_{ms}$ is the surface potential of the channel layer; Q is electric charge in the gate insulating film; $C_{ox}$ is the capacitance of the gate insulating film; and $V_{bi}$ is difference in internal potential between the channel portion and the base portion, the following equations (3) and (4) hold.

$$T_{ch} \leq \sqrt{[(2\varepsilon s/q)\{(N_{cm}+N_{bs})/(N_{cm}\cdot N_{bs})\}\cdot V_{bl}]} + \sqrt{[(2\varepsilon s/q)(1/N_{cm})\{\phi_{ms}-(Q/C_{ox})\}]} \quad (3)$$

$$|N_{cm}| \leq |N_{bs}| \quad (4)$$

It should be understood that $|N_{cm}|$ of the average impurity concentration of the channel layer is expressed by the following equation.

$$|N_{cm}|=|\int N(y)dy/T_{ch}|$$

Since the d-DACFET of this embodiment satisfies the above equations (1) through (4), high current driving force and normally-off operation can be realized.

Further, the absolute value $|N_{bs}|$ of the p-type impurity concentration of the pSiC layer (base layer) is higher than the absolute value $|N_{cm}|$ of the average n-type impurity concentration of the channel layer 20, such that the leakage current produced when the gate is off can be reduced.

Figure 2:
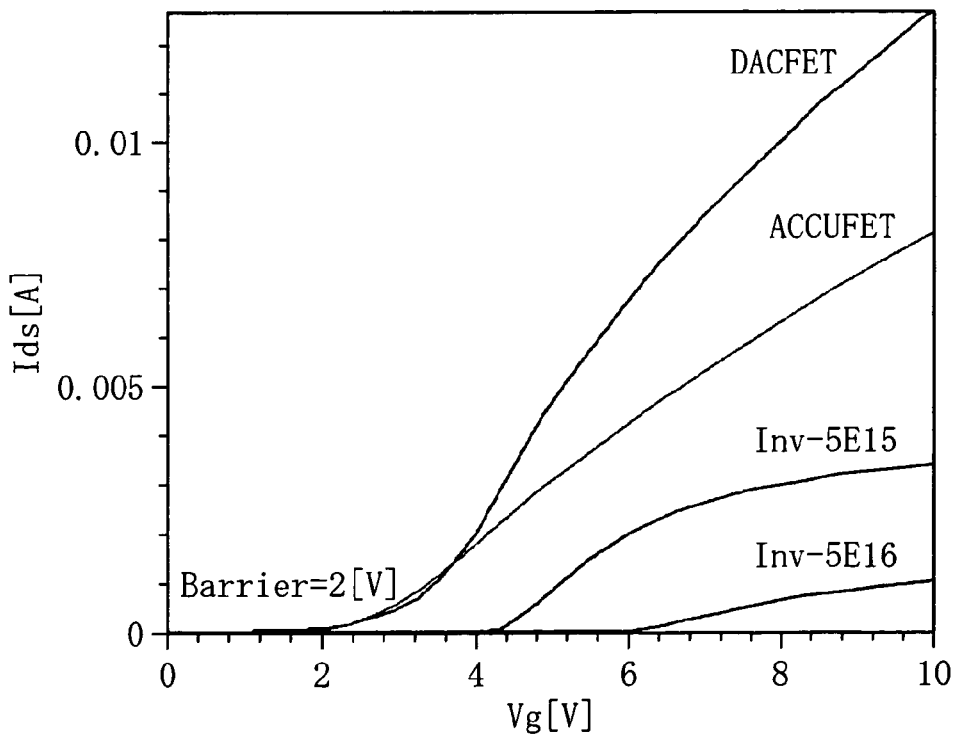
FIG. 2 is a view showing I-V characteristics curves for the d-DACFET of the first embodiment.

FIG. 2 is a view showing results (I-V characteristics curves) of simulating drain current Id-gate voltage Vg characteristics for the d-DACFET of this embodiment. For comparison, FIG. 2 also shows respective I-V characteristics for a conventional accumulation channel SiC-MISFET (identified by ACCUFET) which has the same structure as the d-DACFET of this embodiment and whose channel layer is doped to a substantially uniform concentration and for conventional inversion SiC-MISFETs (identified by Inv) which have the same structure as the d-DACFET of this embodiment and whose respective channel layers are substantially uniformly doped with an impurity having a different conductivity type from that of the d-DACFET of this embodiment. The I-V characteristics shown in FIG. 2 all show I-V characteristics obtained when the voltage between the gate and drain is fixed at 1 V. For the inversion SiC-MISFETs (Inv) shown in FIG. 2, simulation results for cases in which pSiC layers have respective impurity concentrations of about $5.\times10^{15}\cdot cm^{-3}$ and about $5.\times10^{16}\cdot cm^{-3}$ are shown as Inv-5E15 and Inv-5E16.

As shown in FIG. 2, when the gate voltage Vg is 0, almost no drain current flows in the d-DACFET of this embodiment, which indicates that the d-DACFET is operatively normally-off. In the conventional accumulation channel MISFET and the inversion MISFETs, impurity concentration is adjusted so that the MISFETs are operatively normally off. Nevertheless, as compared with the conventional accumulation channel MISFET and the inversion MISFETs, the d-DACFET of this embodiment exhibits a larger drain current Ids when the gate voltage Vg is increased, which means that the d-DACFET of this embodiment has a high current driving force. This indicates how well the d-DACFET of this embodiment performs as a normally-off transistor.

In addition, since a depletion layer extends smoothly to the gate insulating film as will be described later, no kink is created in the Id-Vg characteristics, thereby also achieving optimum performance in the channel resistance.

Figure 3:
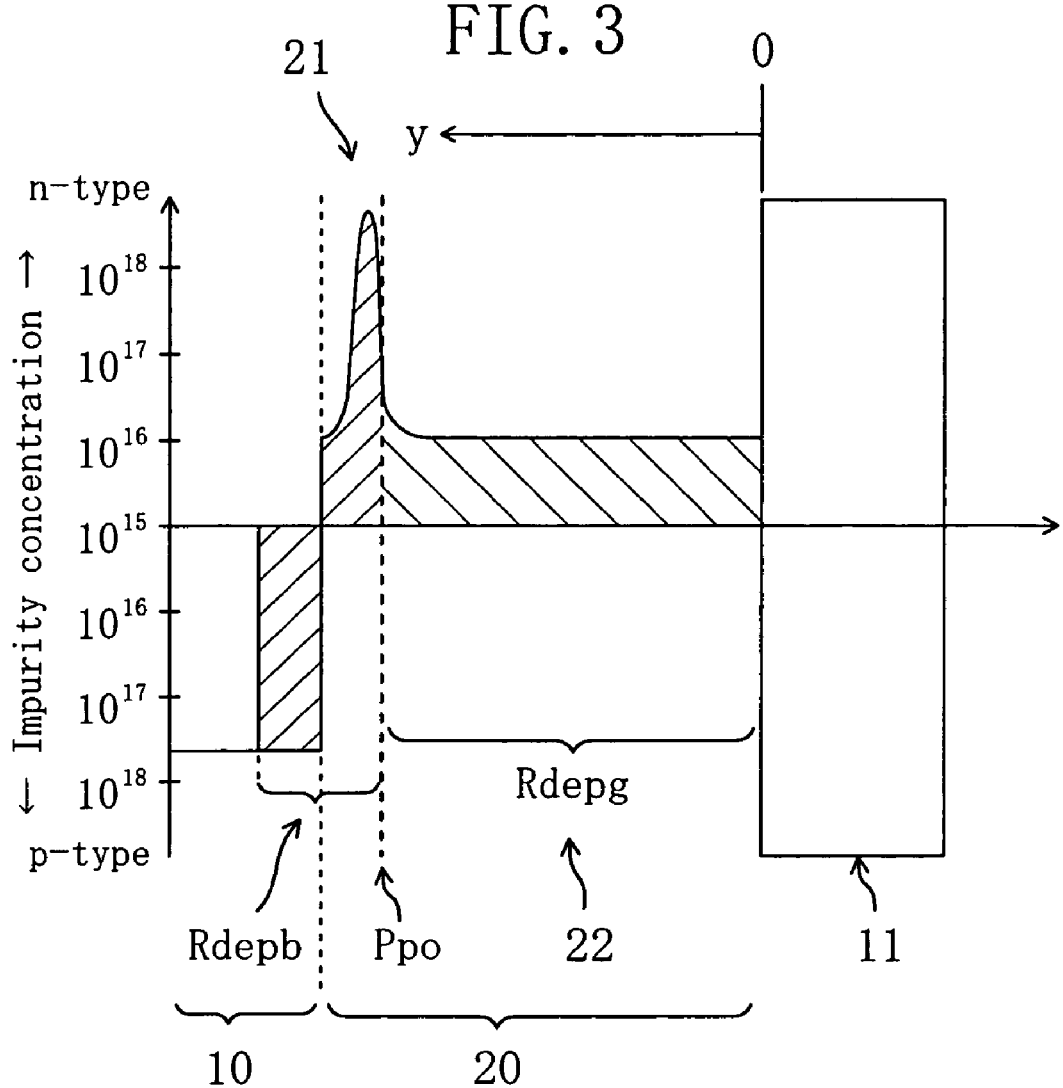
FIG. 3 shows relationship between the impurity concentrations of the channel layer and pSiC layer, and depletion layers in the d-DACFET of the first embodiment.

Next, the principle of operation of the d-DACFET of this embodiment will be described. FIG. 3 shows relationship between the impurity concentrations of the channel layer 20 and pSiC layer 10, and depletion layers in the d-DACFET of the first embodiment. As shown in FIG. 3, a depletion layer Rdepb that extends from the base (pSiC layer 10) expands toward the δ doped layer 21. When a bias of about 0 V is applied to the gate electrode 12, on the other hand, the internal potential of the gate electrode 12 causes a depletion layer Rdepg to extend in the channel layer 20 from the gate side and expand toward the δ doped layer 21. The two depletion layers Rdepb and Rdepg come into contact with each other in a foot area (pinch-off point Ppo) at a low impurity concentration in the vicinity of the upper surface of the δ doped layer 21, resulting in a pinch-off state. In an early stage in increasing the potential of the gate electrode 12, variation in extension of the depletion layer Rdepg is small in the low-impurity-concentration foot area in the vicinity of the upper surface of the δ doped layer 21 because the foot area has a relatively high impurity concentration as compared with the undoped layer 22. However, once the head of the depletion layer Rdepb reaches the undoped layer 22, the depletion layer Rdepb is immediately made uniform from its head to the gate electrode 12, allowing the channel to be in its open state. The width of the depletion layer Rdepb that extends from the base is hardly affected by the variation in the gate bias. In the d-DACFET of this embodiment, therefore, the entire upper portion of the undoped layer 22 located above the δ doped layer 21 acts as it is as a channel, and even if the gate bias is changed, the location of the pinch-off point Ppo hardly varies.

In contrast, in the conventional accumulation channel SiC-MISFET, since the channel layer is doped to a substantially uniform concentration, the location (pinch-off point) in which a depletion layer Rdepg that extends from the gate side makes contact with a depletion layer Rdepb that extends from the base region varies in accordance with variation in the gate bias. Specifically, when the gate bias is small, the pinch-off point is located relatively deep in the channel layer. However, as the gate bias is increased, the pinch-off point moves to a relatively shallow location in the channel layer. Due to this locational difference in the pinch-off points, for example, the above-mentioned differences in the characteristics between the d-DACFET of this embodiment and the conventional accumulation channel SiC-MISFET arise. The mechanism behind this will be described in detail.

Figure 4:
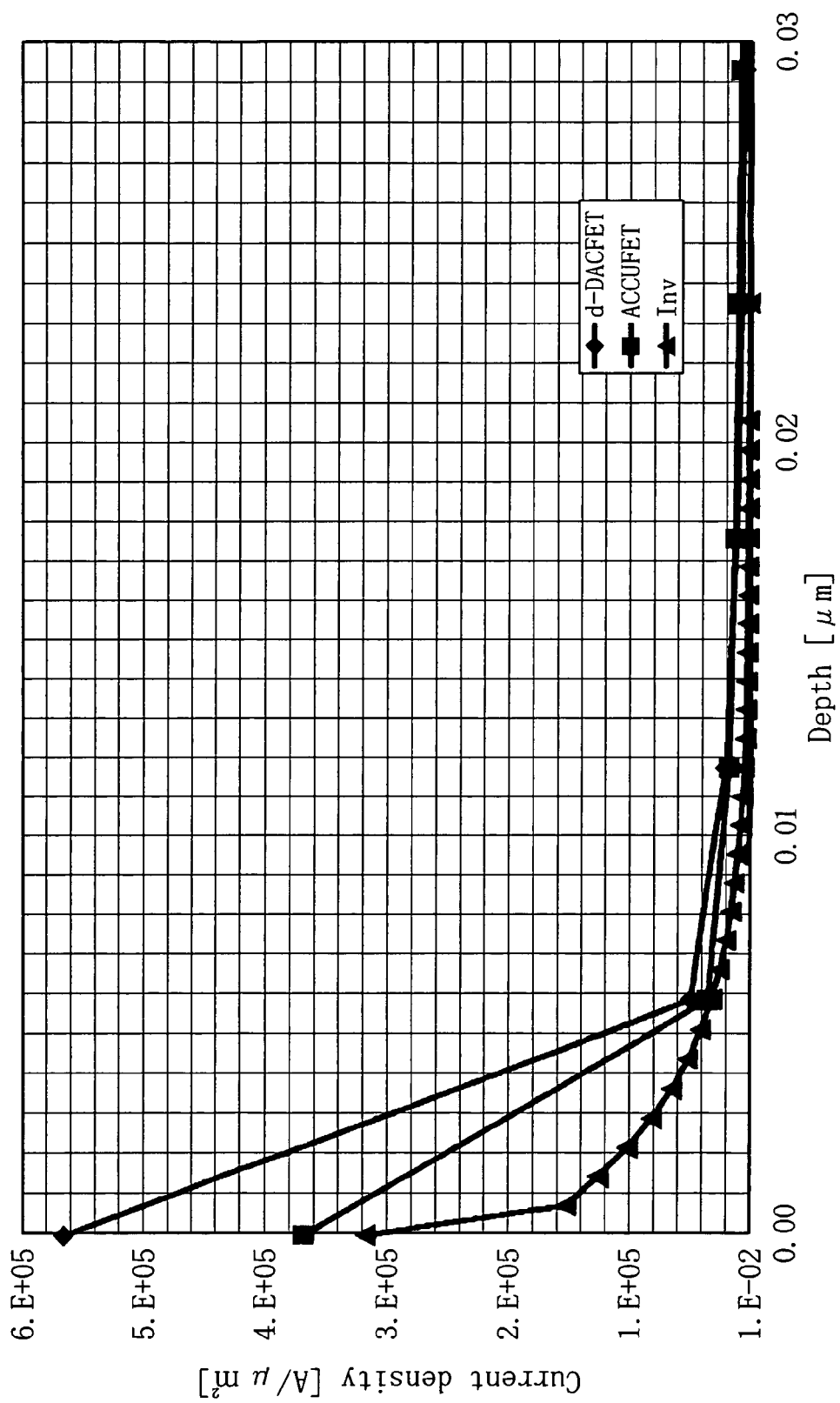
FIG. 4 is a graph showing variation in current density in the depth direction in respective channels in the d-DACFET of the first embodiment, in a conventional accumulation channel SiC-MISFET, and in a conventional inversion SiC-MISFET.

FIG. 4 is a graph showing variation in current density ($A/\mu m^2$) in the depth direction in respective channels in the d-DACFET of this embodiment, in a conventional accumulation channel SiC-MISFET (ACCUFET), and in a conventional inversion SiC-MISFET (Inv). The data shown in FIG. 4 was obtained as a result of performing simulations in which the gate bias was set to 10 V, the drain potential was set to 1 V, and the source potential was set to 0 V.

As shown in the figure, when the surface-region current densities in the respective FET channel layers are compared with each other, the current density in the conventional accumulation channel SiC-MISFET is higher to some extent than that in the conventional inversion SiC-MISFET. In contrast, in the d-DACFET of this embodiment, the current density in the surface region of the channel layer is enhanced to be about twice that of the conventional accumulation channel SiC-MISFET (ACCUFET). This enhancement is achieved for the following reasons.

Figure 5:
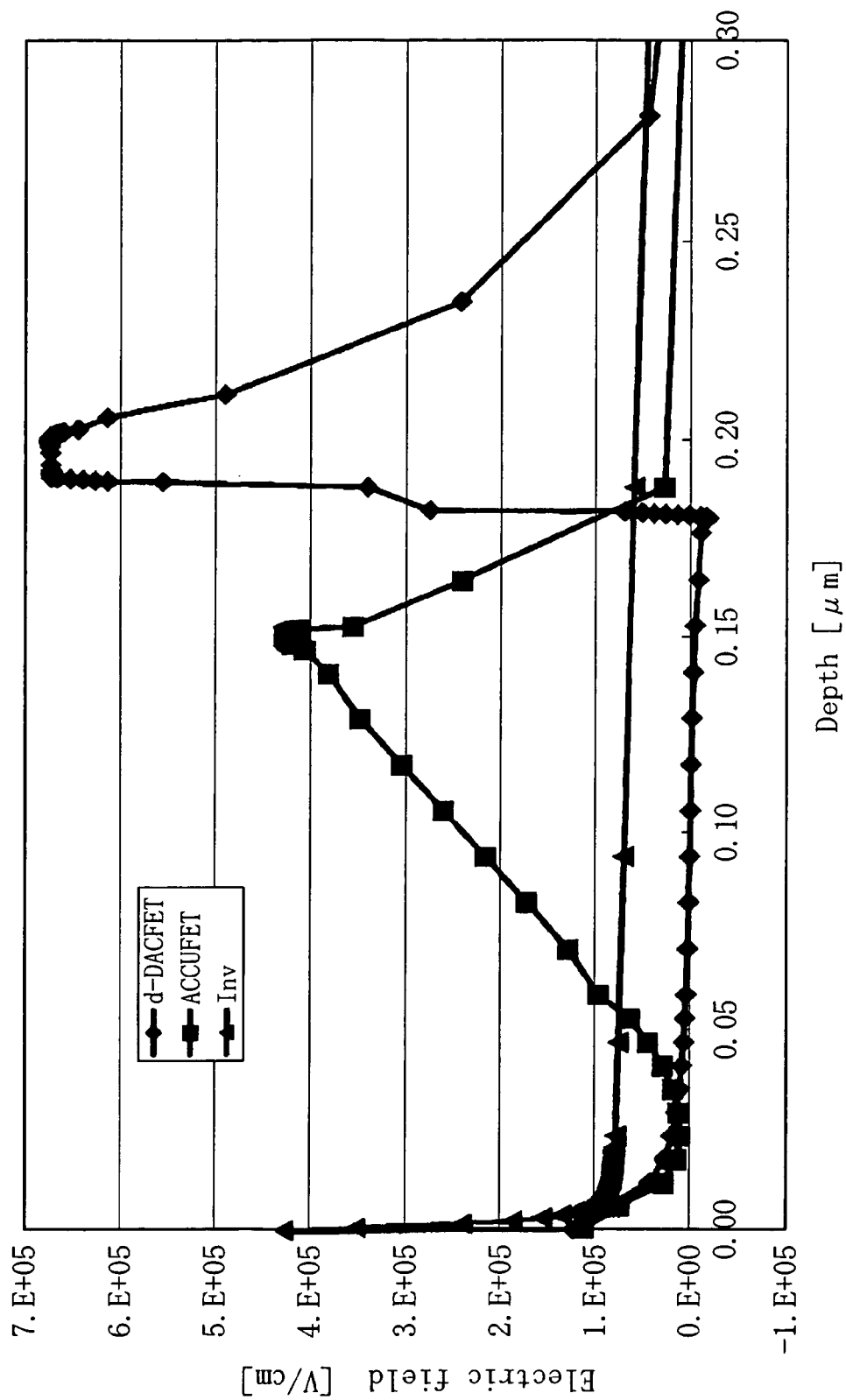
FIG. 5 is a graph showing electric field distribution in the depth direction in respective channels in the d-DACFET of the first embodiment, in the conventional accumulation channel SIC-MISFET, and in the conventional inversion SiC-MISFET.

FIG. 5 is a graph showing electric field (V/cm) distribution in the depth direction in respective channels in the d-DACFET of this embodiment, in the conventional accumulation channel SiC-MISFET (ACCUFET), and in the conventional inversion SiC-MISFET (Inv). The data shown in FIG. 5 was obtained as a result of performing simulations in which the gate bias, the drain potential and the source potential were set to the conditions under which the data shown in FIG. 4 was obtained.

As shown in FIG. 5, in the d-DACFET of this embodiment, the electric field increases in a region (at a depth of 0–0.02 μm) in the immediate vicinity of the surface and in an inner region (at a depth of 0.18–0.25 μm) near the δ doped layer 21, while decreasing to a very low level in that part of the channel-layer upper region (at a depth of 0.025–0.18 μm) located above the δ doped layer but excluding the region in the immediate vicinity of the surface, that is, in the major part of the channel layer. In contrast, the figure shows that although the conventional accumulation channel SiC-MISFET exhibits an electric field substantially the same as that of the d-DACFET of this embodiment in a region (at a depth of 0–0.04 μm) in the vicinity of the surface of the channel layer, the electric field significantly increases in the central portion (at a depth of 0.04–0.18 μm) of the channel layer. Also, in the conventional inversion SiC-MISFET, the electric field created is very large especially in a region near the surface of the channel region. As will be described in the following, such differences in the channel-layer electric field distributions presumably result in difference in carrier mobility among the FETs.

Figure 6:
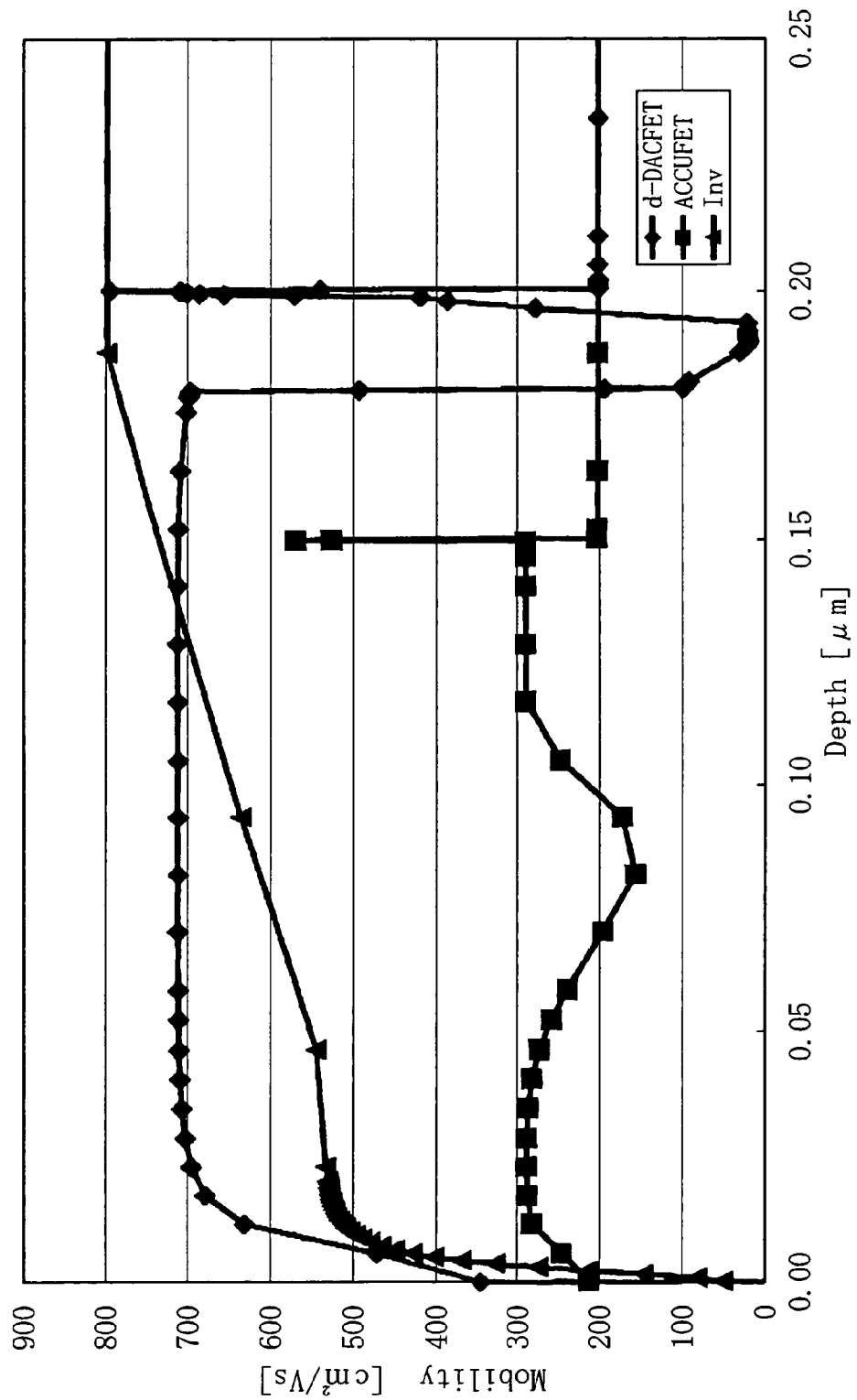
FIG. 6 is a graph showing electron mobility distribution in the depth direction in respective channels in the d-DACFET of the first embodiment, the conventional accumulation channel SiC-MISFET, and the conventional inversion SiC-MISFET.

FIG. 6 is a graph showing electron mobility (cm$^2$/V·s) distribution in the depth direction in respective channels in the d-DACFET of this embodiment, the conventional accumulation channel SiC-MISFET (ACCUFET), and the conventional inversion SiC-MISFET (Inv). The data shown in FIG. 6 was obtained as a result of performing simulations in which the gate bias, the drain potential and the source potential were set to the conditions under which the data shown in FIG. 4 was obtained.

As shown in FIG. 6, in the d-DACFET of this embodiment, the mobility decreases in a region (at a depth of 0–0.02 μm) in the immediate vicinity of the surface and in an inner region (at a depth of 0.18–0.20 μm) near the δ doped layer 21, while increasing to a very high level in the upper region (at a depth of 0.02–0.18 μm) of the channel layer located above the δ doped layer except for the region in the immediate vicinity of the surface, that is, in the major part of the channel layer. In contrast, it is found that in the conventional accumulation channel SiC-MISFET, the mobility is low throughout the channel layer. Also, in the conventional inversion SiC-MISFET, the mobility extremely decreases especially in a region near the surface of the channel region.

Comparing FIGS. 5 and 6, the d-DACFET of this embodiment exhibits higher current driving force presumably because of the following reasons.

First, in general, mobility presumably decreases in a region in which a high electric field is applied. In the d-DACFET of this embodiment, the mobility increases in the regions in which the applied electric filed is low, and the mobility decreases in the regions in which the applied electric field is high. Since the high-concentration δ doped layer 21 is provided in the deep region of the channel layer in the d-DACFET of this embodiment, the applied high electric is high in a region in the vicinity of the δ doped layer 21, that is, the deep region of the channel layer. However, the applied electric field is low in the region of the channel layer 20 located above the δ doped layer 21 except for the region in the vicinity of the surface, thus realizing the high mobility in this region. This presumably results in the high current density obtained in the near-surface region (at a depth of 0–0.006 μm) in the d-DACFET of this embodiment as shown in FIG. 4.

On the other hand, with the conventional inversion SiC-MISFET, since due to the mechanics, high voltage is applied to the interface between the gate insulating film and the channel layer in order to form an inversion region, the current density obtainable is small as a whole.

The conventional accumulation channel SiC-MISFET can be considered to be aimed at higher current density as compared with the inversion SiC-MISFET. However, in the conventional accumulation channel SiC-MISFET, although the intensity of the electric field in the region near the surface hardly differs from that in the d-DACFET of this embodiment, the electric field applied to the region directly under the surface of the channel layer is high. This causes carriers to accelerate in the channel layer toward the surface thereof, and the carriers are thus likely to be affected by interface states, for example. Probably as a result of this, the current density in the region near the surface does not increase very much.

It should be understood that when the δ doped layer 21 is provided below a middle position of the channel layer 20, the equations (1) and (2) can be satisfied such that the effects of this embodiment can be exhibited.

It is preferable that the thickness of the δ doped layer 21 be not more than 10 nm so that the region to which high electric filed is applied is limited as much as possible.

Second Embodiment

Figure 7:
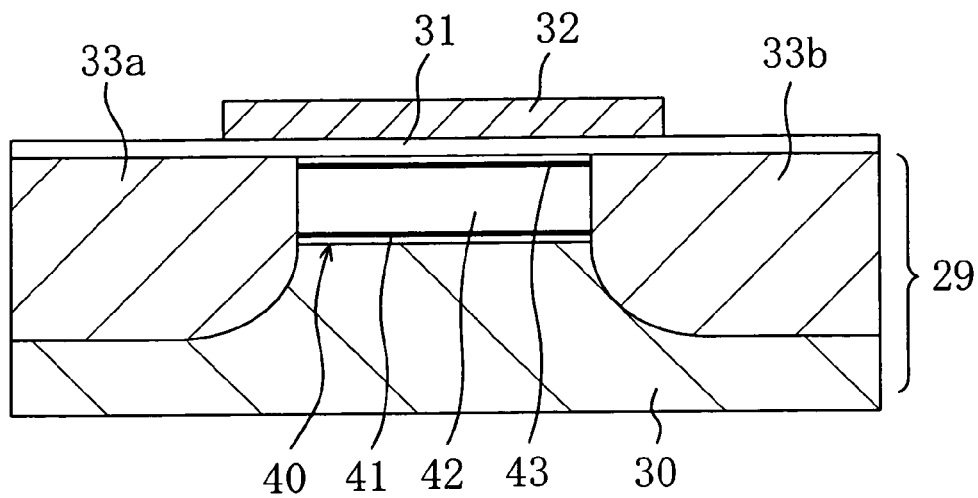
FIG. 7 is a cross sectional view illustrating the basic structure of a semiconductor device in accordance with a second embodiment of the present invention.

FIG. 7 is a cross sectional view illustrating the basic structure of a semiconductor device (SiC-MISFET (d-DACFET)) in accordance with a second embodiment of the present invention.

As shown in FIG. 7, the d-DACFET of this embodiment includes an epitaxial SiC layer 29 formed by epitaxial growth on an SiC substrate (not shown) having a 4H—SiC structure. The epitaxial SiC layer 29 includes a p-type SiC layer 30, which is a base region, and an n-type channel layer 40, which is formed on the p-type SiC layer 30 and modulation-doped by in-situ doping. The d-DACFET of this embodiment further includes a gate insulating film 31, a gate electrode 32, an n-type source layer 33a, and an n-type drain layer 33b. The gate insulating film 31 is formed on the channel layer 40 by thermal oxidation. The gate electrode 32 is formed on the gate insulating film 31. The respective n-type source and drain layers 33a and 33b are formed by implanting an n-type impurity into regions in the channel layer 40 and SiC layer 30 located on either side of the gate electrode 32.

The channel layer 40 includes an n-type undoped layer 42 (low-concentration doped layer), an n-type deep-portion δ doped layer 41 (high-concentration doped layer), and an n-type surface-portion δ doped layer 43. The undoped layer 42 has an impurity concentration of about $1.\times10^{16}$·cm$^{-3}$ and a thickness of about 200 nm. The deep-portion δ doped layer 41, interposed in the undoped layer 42, has an impurity concentration of about $2.2\times10^{18}$·cm$^{-3}$ and a thickness of about 10 nm. The surface-portion δ doped layer 43, interposed in the undoped layer 42, has an impurity concentration of about $1\times10^{18}$·cm$^{-3}$ and a thickness of about 10 nm. The lower surface of the deep-portion δ doped layer 41 and the upper surface of the p-type SiC layer 30 (that is the junction plane between the p-type SIC layer 30 and the channel layer 40) are spaced apart from each other by only 10 nm. The upper surface of the surface-portion δ doped layer 43 and the lower surface of the gate insulating film 31 (that is the interface between the gate insulating film 31 and the channel layer 40) are spaced apart from each other by only 10 nm. The n-type source and drain layers 33a and 33b each have an impurity concentration of about $1.\times10^{20}$·cm$^{-3}$ and a thickness of about 350 nm. The p-type impurity concentration of the p-type SiC layer 30 is about $5.\times10^{17}\cdot cm^{-3}$. The channel layer 40 in the SIC-MISFET of this embodiment has an average impurity concentration of about $2.\times10^{17}\cdot cm^{-3}$ and a thickness of 200 nm.

The d-DACFET of this embodiment is characterized by having an accumulation channel MISFET structure that includes the n-type source and drain layers 33a and 33b, the p-type SiC layer 30 that is the p-type base region doped to the substantially uniform concentration, and the modulation-doped n-type channel layer 40, and by further including the surface-portion δ doped layer 43 in addition to the high-concentration, deep-portion δ doped layer 41 located in the deep region of the channel layer 40.

In the d-DACFET of this embodiment, the channel layer is also formed to satisfy the above equations (1) through (4). In other words, the channel layer is designed so that the amount of impurity in the overall surface-portion δ doped layer 43 is smaller than the amount of impurity in the overall deep-portion δ doped layer 43, that is, so that the center of gravity of the impurity concentration is located below a middle position of the channel layer. Then, normally-off operation can be easily realized.

The d-DACFET of this embodiment and the structure described in the first embodiment are the same in that the pinch-off point in the channel layer is a foot area that has a low impurity concentration and is located on the surface side the deep-portion δ doped layer 41. However, the structure of the d-DACFET of this embodiment differs from that of the first embodiment in that the surface-portion δ doped layer 43 is provided in the undoped layer 42. Since the existence of the surface-portion δ doped layer 43 allows a large number of carriers to be supplied to a region of the channel layer 40 in the vicinity of its surface, channel resistance can be further reduced.

Moreover, since the d-DACFET of this embodiment satisfies the equations (1) through (4), like the d-DACFET of the first embodiment, the d-DACFET of this embodiment is operatively normally off. When the d-DACFET of this embodiment should not operate as a normally-off device, the d-DACFET may have a structure in which the deep-portion δ doped layer 41 and the surface-portion δ doped layer 43 have the same impurity concentration.

Third Embodiment

Figure 8:
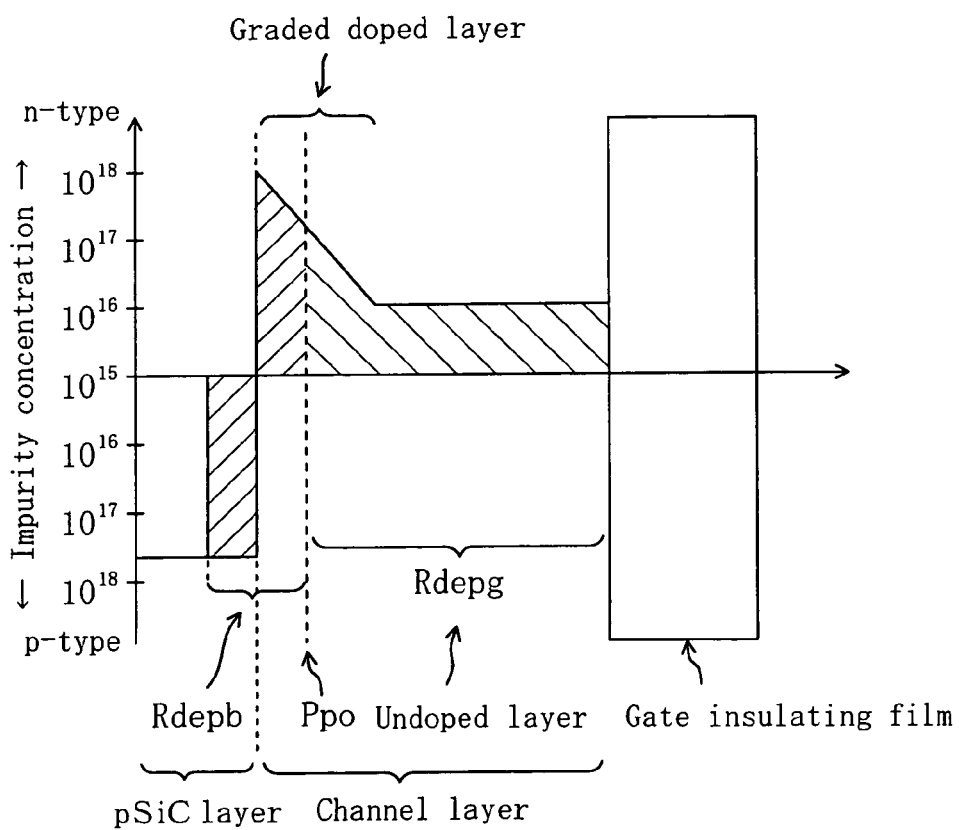
FIG. 8 shows relationship between the impurity concentrations of a channel layer and a pSiC layer, and depletion layers in a semiconductor device in accordance with a third embodiment of the present invention.

FIG. 8 shows relationship between the impurity concentrations of a channel layer and a pSiC layer, and depletion layers in a semiconductor device (SiC-MISFET (d-DACFET)) in accordance with a third embodiment of the present invention. As shown in FIG. 8, the d-DACFET of this embodiment includes in the channel layer, instead of the δ doped layer 21 in the d-DACFET of the first embodiment shown in FIG. 1, a graded doped layer (high-concentration doped layer) in which impurity concentration decreases heading from its deeper portion toward its surface. The lower end of the graded doped layer is in contact with the pSiC layer. The impurity concentration of the deepest portion of the graded doped layer, which is about $5.0\times10^{18}\cdot cm^{-3}$, decreases almost continuously tending toward the impurity concentration (about $1.\times10^{16}\cdot cm^{-3}$) of the undoped layer. The graded doped layer has a thickness of about 10 nm.

In the d-DACFET of this embodiment, a depletion layer Rdepb that extends from the base (pSiC layer) comes into contact with a depletion layer Rdepg that extends from the gate side in a graded region of the graded doped layer, resulting in a pinch-off state. In other words, the pinch-off point Ppo is located in the graded region. Therefore, the electric field effected in the deeper portion of the channel layer is relatively high, while the effected electric field in the region of the channel layer located above the graded doped layer except for a region in the vicinity of the surface is always small. This, as in the first embodiment, allows a high carrier mobility to be realized in the region of the channel layer located above the graded doped layer except for the region near the surface, thereby achieving a high current driving force.

Forth Embodiment

Figure 9:
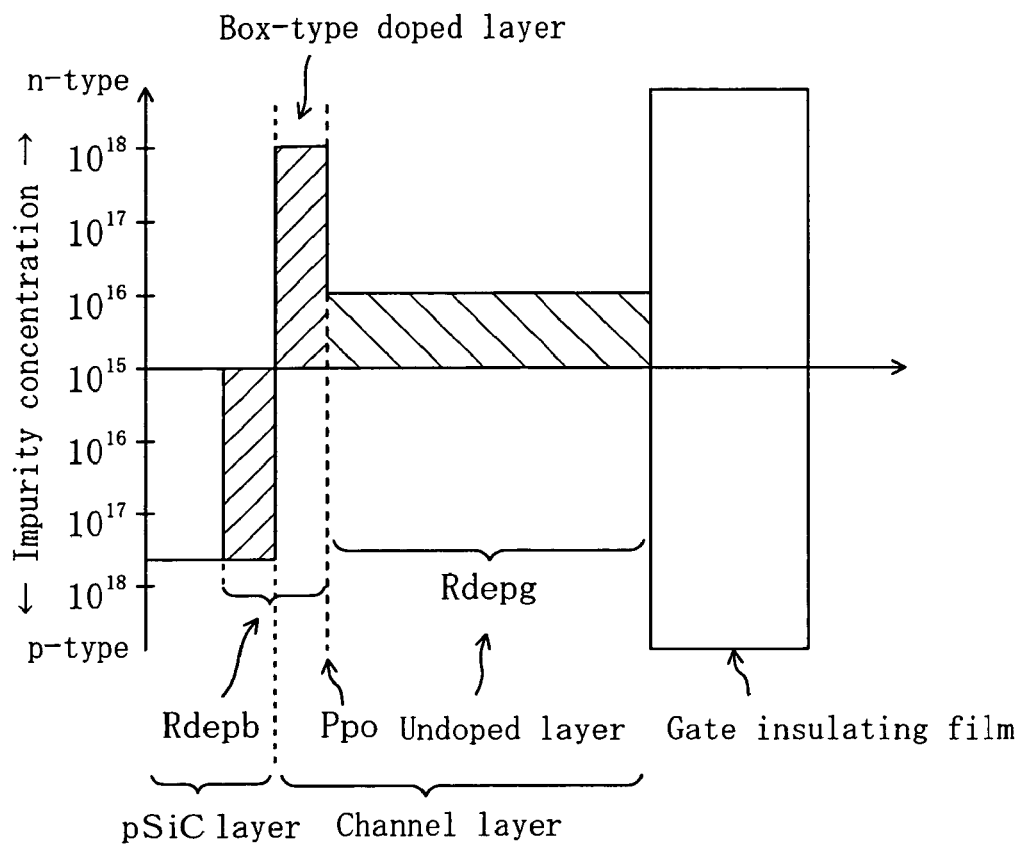
FIG. 9 shows relationship between the impurity concentrations of a channel layer and a pSiC layer, and depletion layers in a semiconductor device in accordance with a fourth embodiment of the present invention.

FIG. 9 shows relationship between the impurity concentrations of a channel layer and a pSiC layer, and depletion layers in a semiconductor device (SiC-MISFET (d-DACFET)) in accordance with a fourth embodiment of the present invention. As shown in FIG. 9, the d-DACFET of this embodiment includes in the channel layer, instead of the δ doped layer 21 in the d-DACFET of the first embodiment shown in FIG. 1, a uniformly doped layer (high-concentration doped layer) that has a substantially uniform impurity concentration. The lower end of the uniformly doped layer is in contact with the pSiC layer. The impurity concentration of the deepest portion of the uniformly doped layer is not less than about $5\times10^{17}\cdot cm^{-3}$. The uniformly doped layer has a thickness of about 20 nm.

In the d-DACFET of this embodiment, a depletion layer Rdepb that extends from the base (pSiC layer) comes into contact with a depletion layer Rdepg that extends from the gate side in the upper end portion (pinch-off point Ppo) of the uniformly doped layer, resulting in a pinch-off state. The uniformly doped layer, which functions to make the depletion layer Rdepb that extends from the base be stable against the influence of gate-bias variation, acts as a so-called depletion-layer stopper. To that end, the impurity concentration of the deepest portion of the uniformly doped layer is preferably about $5\times10^{17}\cdot cm^{-3}$ or more, and the uniformly doped layer should have a thickness larger than that of the depletion layer Rdepb that extends from the base.

Given that $N_s$ is the impurity concentration of the depletion-layer stopper (the uniformly doped layer), the thickness $T_{ds}$ of the depletion-layer stopper is preferably designed so that the following equation (5) is satisfied.

$$T_{ds} \geq \{N_{bs}/(N_s + N_{bs})\} \times \sqrt{[(2\varepsilon s/q) \cdot \{(N_s + N_{bs})/(N_s \cdot N_{bs})\} \cdot V_{bi}]} \quad (5)$$

In order to cause pinch-off at the boundary between the depletion-layer stopper (the uniformly doped layer) and the channel, given that $N_{ud}$ is the impurity concentration of the undoped layer, the thickness $T_{ud}$ of the undoped layer should be designed to satisfy the following equation (6).

$$T_{ud} \leq [(2\varepsilon s/q)(1/N_{ud})\{\phi_{ms}-(Q/C_{ox})\}] \quad (6)$$

Thus, when the thickness $T_{ud}+T_{ds}$ of the entire channel layer of the device is designed to satisfy the following equation (7), the d-DACFET of this embodiment operates as a normally-off device and its performance is optimized.

$$T_{ud} + T_{ds} \leq \sqrt{[(2\varepsilon s/q) \cdot \{(N_s + N_{bs})/(N_s \cdot N_{bs})\} \cdot V_{bi}]} + \sqrt{[(2\varepsilon s/q)(1/(N_{ud})\{\phi_{ms} - (Q/C_{ox})\}]} \quad (7)$$

In the d-DACFET of this embodiment, the electric field effected in the deeper portion of the channel layer is relatively high, while the effected electric field in the region of the channel layer located above the graded doped layer except for a region in the vicinity of the surface is always small. Thus, as in the first embodiment, a high carrier mobility is obtained in the region of the channel layer located above the graded doped layer except for the region near the surface, thereby achieving a high current driving force.

In the d-DACFET of this embodiment, it is preferable that when a voltage of about "0" is applied to the gate, the depletion layer Rdepb that extends from the base (pSiC layer) side and the depletion layer Rdepg that extends from the gate side come into contact with each other in a region of transition from the uniformly doped layer (the depletion-layer stopper) to the undoped layer, thereby causing pinch-off.

Fifth Embodiment

Figure 10:
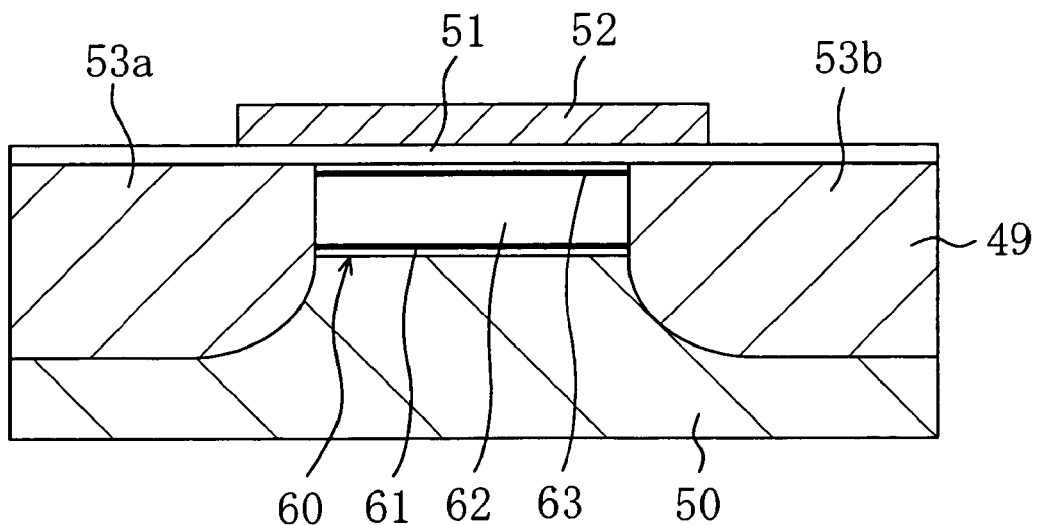
FIG. 10 is a cross sectional view illustrating the basic structure of a semiconductor device in accordance with a fifth embodiment of the present invention.

FIG. 10 is a cross Sectional view illustrating the basic structure of a semiconductor device (SiC-MISFET (d-DACFET)) in accordance with a fifth embodiment of the present invention.

As shown in FIG. 10, the d-DACFET of this embodiment includes an epitaxial SiC layer 49 formed by epitaxial growth on an SiC substrate (not shown) having a 4H—SiC structure. The epitaxial SiC layer 49 includes a p-type SiC layer 50, which is a base region, and an n-type channel layer 60, which is formed on the p-type SiC layer 50 and modulation-doped by in-situ doping. The d-DACFET of this embodiment further includes a gate insulating film 51, a gate electrode 52, an n-type source layer 53a, and an n-type drain layer 53b. The gate insulating film 51 is formed on the channel layer 60 by thermal oxidation. The gate electrode 52 is formed on the gate insulating film 51. The respective n-type source and drain layers 53a and 53b are formed by implanting an n-type impurity into regions in the channel layer 60 and SiC layer 50 located on either side of the gate electrode 52.

The channel layer 60 includes an n-type undoped layer 62 (low-concentration doped layer), an n-type deep-portion δ doped layer 61 (high-concentration doped layer), and a p-type surface-portion δ doped layer 63. The undoped layer 62 has an impurity concentration of about $1. \times 10^{16} \cdot cm^{-3}$ and a thickness of about 200 nm. The deep-portion δ doped layer 61, interposed in the undoped layer 62, has an impurity concentration of about $4.2 \times 10^{18} \cdot cm^{-3}$ and a thickness of about 10 nm. The surface-portion δ doped layer 63, existing in the undoped layer 62, has an impurity concentration of about $1 \times 10^{18} \cdot cm^{-3}$ and a thickness of about 10 nm. The surface-portion δ doped layer 63 and the gate insulating film 51 make contact with each other. The n-type source and drain layers 53a and 53b each have an impurity concentration of about $1. \times 10^{20} \cdot cm^{-3}$ and a thickness of about 350 nm. The p-type impurity concentration of the p-type SiC layer 50 is about $5. \times 10^{17} \cdot cm^{-3}$. The channel layer 60 of the d-DACFET of this embodiment has an average impurity concentration of about $2. \times 10^{17} \cdot cm^{-3}$ and a thickness of 200 nm.

In this embodiment, since it is possible to suppress the gate insulating film from adversely affecting the channel, performance (for example, current driving force) of the d-DACFET can be made optimum when a gate bias Vg is within a 0 to 20 V range.

In this embodiment, in addition to the structure of the first embodiment, the surface-portion δ doped layer 63 is provided. When such a surface-portion δ doped layer is provided in the third and fourth embodiments, the same effects as in this embodiment are exhibited.

Sixth Embodiment

Figure 11:
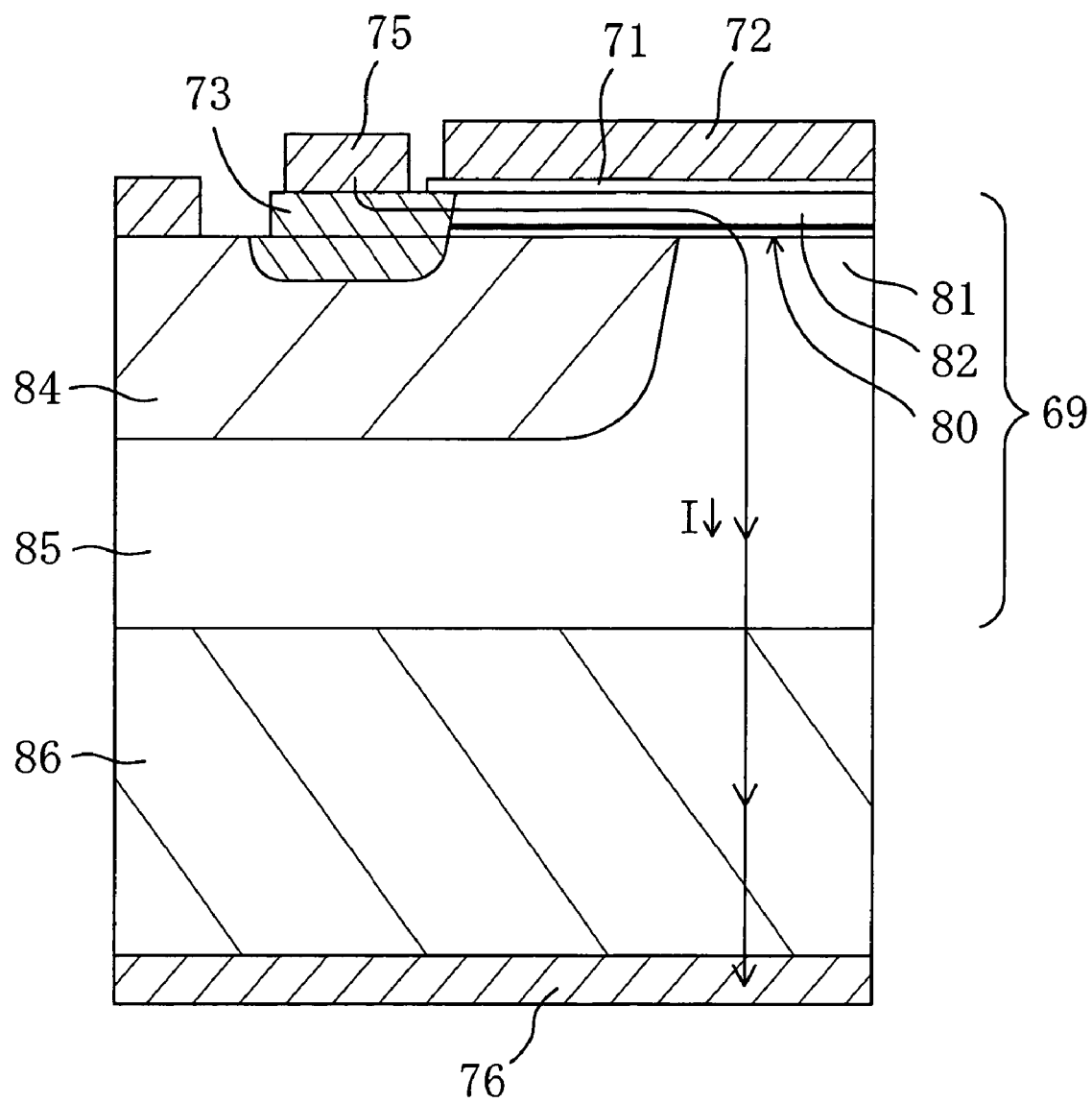
FIG. 11 is a cross sectional view illustrating the basic structure of a semiconductor device in accordance with a sixth embodiment of the present invention.

FIG. 11 is a cross sectional view illustrating the basic structure of a semiconductor device (SiC-MISFET (vertical d-DACFET)) in accordance with a sixth embodiment of the present invention.

As shown in FIG. 11, the vertical d-DACFET of this embodiment includes an epitaxial SiC layer 69 formed by epitaxial growth on a high-concentration n-type SiC layer (drain layer) 86 that is an SiC substrate having a 4H—SiC structure. The epitaxial SiC layer 69 includes a low-concentration n-type SiC layer 85 and an n-type channel layer 80, which is formed on the low-concentration n-type SiC layer 85 and modulation-doped by in-situ doping. The vertical d-DACFET of this embodiment further includes a gate insulating film 71, a gate electrode 72, an n-type source layer 73, a p-well 84, a source electrode 75, and a drain electrode 76. The gate insulating film 71 is formed on the channel layer 80 by thermal oxidation. The gate electrode 72 is formed on the gate insulating film 71. The n-type source layer 73 is formed by introducing an n-type impurity into regions in the channel layer 80 and low-concentration n-type SiC layer 85 located laterally with respect to the gate electrode 72. The p-well 84, which is formed by introducing a p-type impurity into a region in the low-concentration SiC layer 85, surrounds the bottom face of the source layer 73. The source electrode 75 is formed on the source layer 73. The drain electrode 76 is provided on the lower surface of the high-concentration n-type SiC layer 86.

The channel layer 80 includes an n-type undoped layer 82 (low-concentration doped layer) and an n-type δ doped layer 81 (high-concentration doped layer). The n-type undoped layer 82 has an impurity concentration of about $1. \times 10^{16} \cdot cm^{-3}$ and a thickness of about 200 nm. The δ doped layer 81, interposed in the undoped layer 82, has an impurity concentration of about $3.2 \times 10^{18} \cdot cm^{-3}$ and a thickness of about 10 nm. The δ doped layer 81 and the p-well 84 or the low-concentration n-type SiC layer 85 are spaced apart from each other by only 10 nm. The n-type source layer 73 and the high-concentration n-type SiC layer (drain layer) 86 have an impurity concentration of about $1. \times 10^{20} \cdot cm^{-3}$. The p-type impurity concentration of the p-well 84 is about $5. \times 10^{17} \cdot cm^{-3}$. The channel layer 80 in the vertical d-DACFET of this embodiment has an average impurity concentration of about $2. \times 10^{17} \cdot cm^{-3}$ and a thickness of 200 nm.

In the vertical d-DACFET of this embodiment, in addition to the same effects of the first embodiment, effects characteristic of a vertical transistor can be exhibited. Specifically, keeping wide a region (see a solid line arrow shown in FIG. 11) in which current I flows enables large current flow. The vertical d-DACFET of this embodiment has the structure that makes the vertical d-DACFET particularly suited to serve as a power transistor in large-power applications.

Seventh Embodiment

Figure 12:
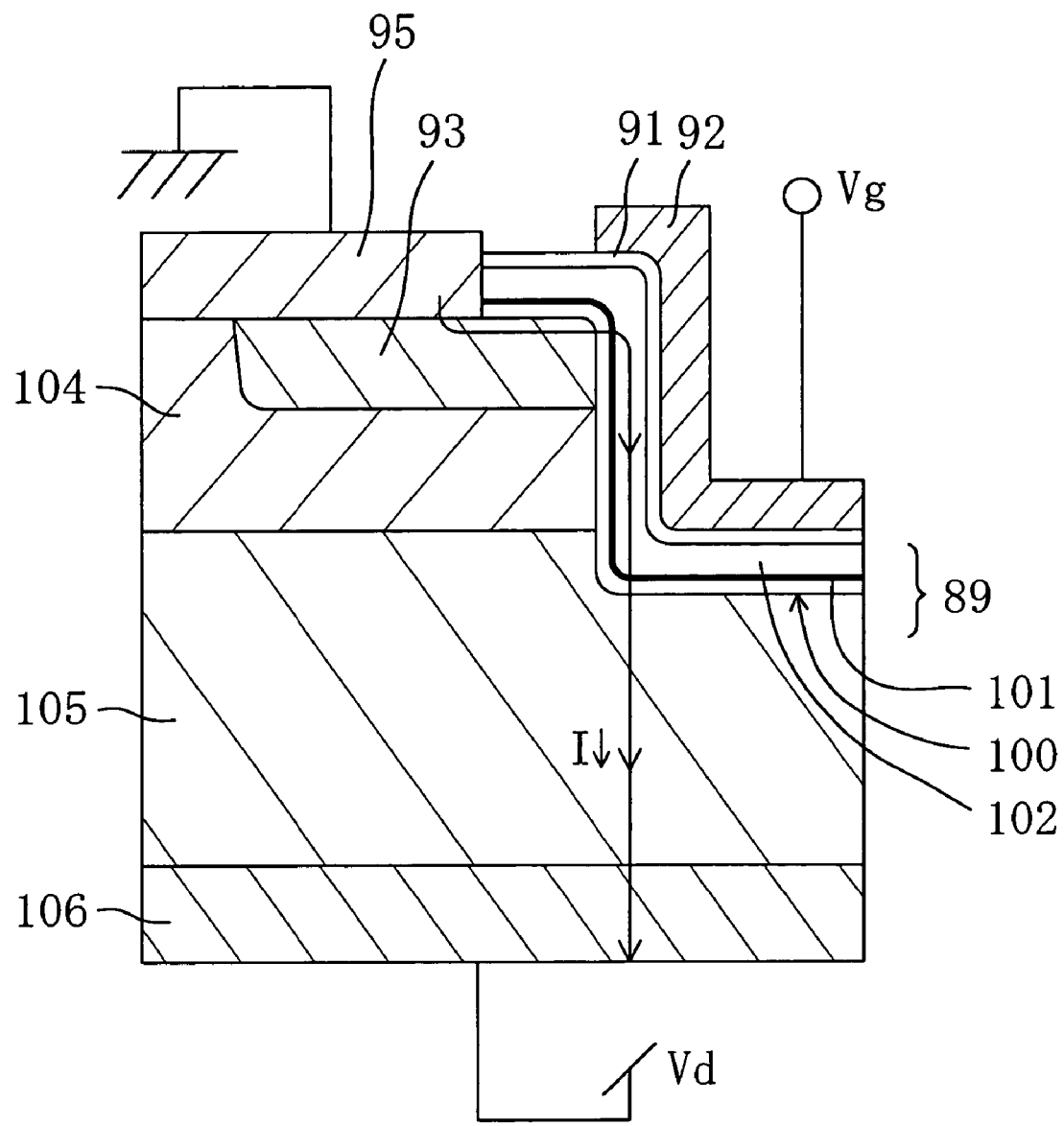
FIG. 12 is a cross sectional view illustrating the basic structure of a semiconductor device in accordance with a seventh embodiment of the present invention.

FIG. 12 is a cross sectional view illustrating the basic structure of a semiconductor device (SiC-MISFET (UMOS d-DACFET)) in accordance with a seventh embodiment of the present invention.

As shown in FIG. 12, the SiC-MISFET of this embodiment includes an epitaxial SiC layer 89 formed by epitaxial growth, over a high-concentration n-type SiC layer (drain layer) 106 that is an SiC substrate having a 4H—SiC structure and on an n⁻-type drift layer 105. The epitaxial SiC layer 89 includes on the drift layer 105 a p-well 104 and an n-type channel layer 100, which is modulation-doped by in-situ doping. The UMOS d-DACFET of this embodiment further includes a gate insulating film 91, a gate electrode 92, an n-type source layer 93, a source electrode 95, and a drain electrode 106. The gate insulating film 91 is formed on the channel layer 100 by thermal oxidation. The gate electrode 92 is formed on the gate insulating film 91. The n-type source layer 93 is formed by introducing an n-type impurity into regions in the channel layer 100 and p-well 104 located laterally with respect to the gate electrode 92. The source electrode 95 is formed on the source layer 93. The drain electrode 106 is provided on the lower face of the high-concentration n-type SiC layer 106.

The channel layer 100 includes an n-type undoped layer 102 (low-concentration doped layer) and an n-type δ doped layer 101 (high-concentration doped layer). The n-type undoped layer 102 has an impurity concentration of about $1. \times 10^{16} \cdot cm^{-3}$ and a thickness of about 200 nm. The δ doped layer 101, interposed in the undoped layer 102, has an impurity concentration of about $3.2 \times 10^{18} \cdot cm^{-3}$ and a thickness of about 10 nm. The δ doped layer 101 and the source layer 93, the p-well 104 or the drift layer 105 are spaced apart from each other by only 10 nm. The n-type source layer 93 and the high-concentration n-type SiC layer (drain layer) 106 have an impurity concentration of about $1. \times 10^{20} \cdot cm^{-3}$. The p-type impurity concentration of the p-well 104 is about $5. \times 10^{17} \cdot cm^{-3}$. The channel layer 100 in the UMOS d-DACFET of this embodiment has an average impurity concentration of about $2. \times 10^{17} \cdot cm^{-3}$ and a thickness of 200 nm.

In the UMOS d-DACFET of this embodiment, in addition to the same effects of the first embodiment, effects characteristic of a UMOS transistor can be exhibited. Specifically, keeping wide a region (see a solid line arrow shown in FIG. 12) in which current I flows enables large current flow. The UMOS d-DACFET of this embodiment has the structure that makes the UMOS d-DACFET particularly suited to serve as a power transistor in large-power applications.

Eighth Embodiment

Figure 13:
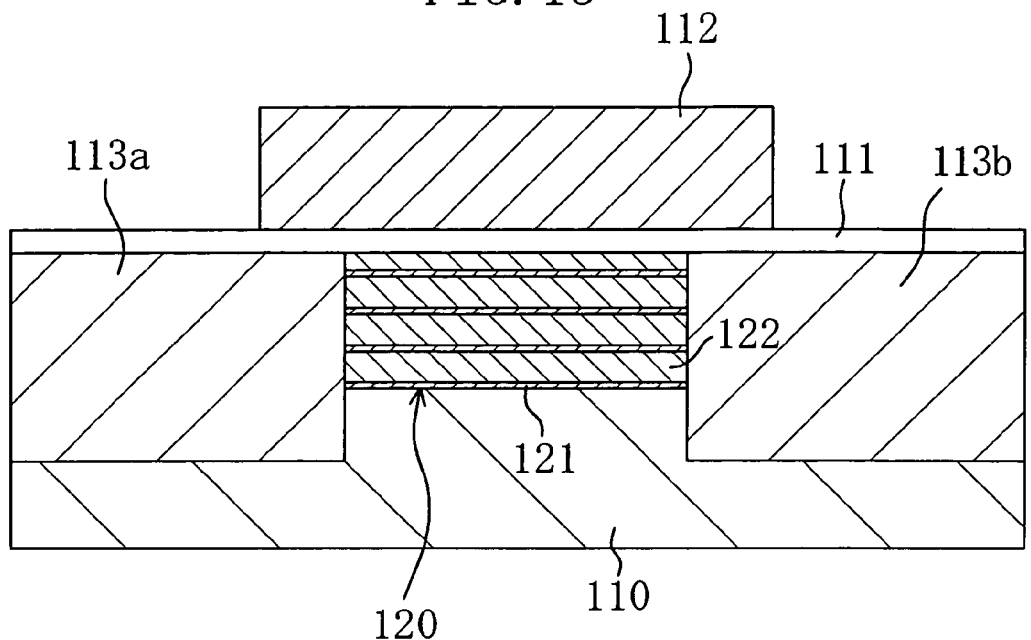
FIG. 13 is a cross sectional view illustrating the basic structure of a semiconductor device in accordance with an eighth embodiment of the present invention.

FIG. 13 is a cross sectional view illustrating the basic structure of a semiconductor device (SiC-MISFET) in accordance with an embodiment of the present invention.

As shown in FIG. 13, the SiC-MISFET of this embodiment includes: a p-type SiC layer 110 which is a region formed by epitaxial growth on an SiC substrate (not shown) having a 4H—SiC structure; an n-type channel layer 120 formed on the p-type SiC layer 110; a gate insulating film 111 formed on the channel layer 120 by thermal oxidation; a gate electrode 112 formed on the gate insulating film 111; and n-type source and drain layers 113a and 113b formed by implanting an n-type impurity into regions in the channel layer 120 and SiC layer 110 located on either side of the gate electrode 112.

The channel layer 120 is formed by alternately stacking n-type δ doped layers 121 (high-concentration layers) and undoped layers 122 (low-concentration doped layer). The n-type δ doped layers 121 have an impurity concentration of about $1 \times 10^{18} \cdot cm^{-3}$ and a thickness of about 10 nm. The undoped layers 122 have an impurity concentration of about $1. \times 10^{16} \cdot cm^{-3}$ and a thickness of about 50 nm. It should be noted that the uppermost undoped layer 122 in the channel layer 120 has a thickness of about 15 nm. The n-type source and drain layers 113a and 113b each have an impurity concentration of about $1. \times 10^{18} \cdot cm^{-3}$ and a thickness of about 300 nm. The p-type impurity concentration of the p-type SiC layer 110 is about $1. \times 10^{18} \cdot cm^{-3}$.

Specifically, the SiC-MISFET of this embodiment has an accumulation channel MISFET structure that includes the n-type source and drain layers 113a and 113b, the p-type SiC layer 110 that is a p-type region, and the n-type channel layer 120. The channel layer 120 in this embodiment is formed by alternately stacking the n-type δ doped layers 121 and the undoped layers 122.

Figure 14:
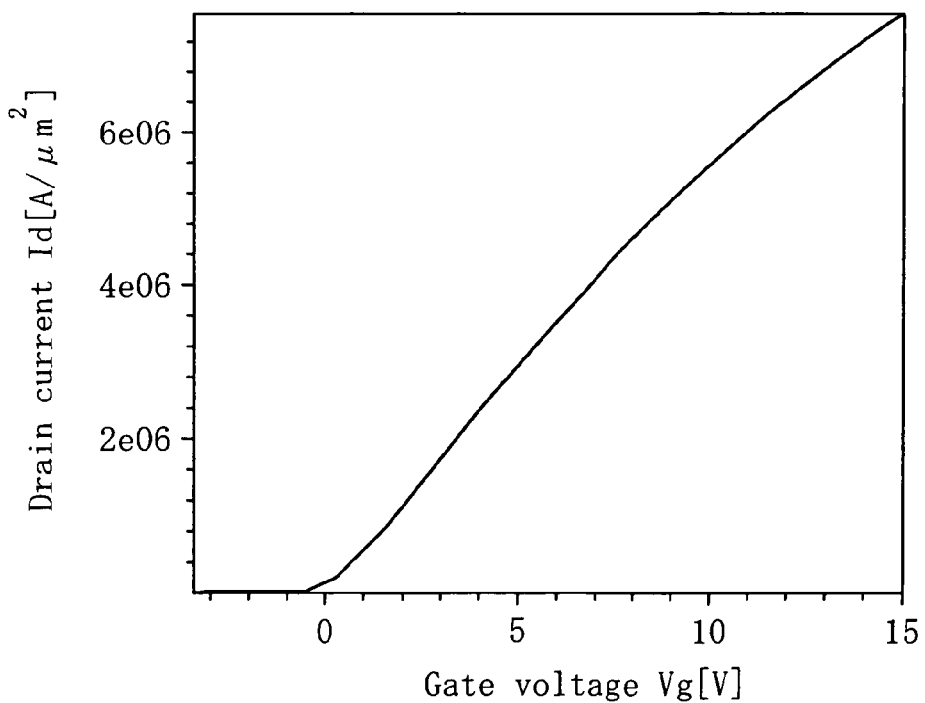
FIG. 14 is a graph showing results of simulating drain current—gate voltage characteristics for the SiC-MISFET of the eighth embodiment.

FIG. 14 is a graph showing results (I-V characteristics curves) of simulating drain current Id-gate voltage Vg characteristics for the SiC-MISFET of this embodiment. The I-V characteristics in FIG. 14 show I-V characteristics obtained when the voltage between the gate and drain is fixed at 1 V. As shown in FIG. 14, when the gate voltage Vg is 0, almost no drain current flows in the SiC-MISFET of this embodiment, which means that the SiC-MISFET operates as a normally-off device.

Figure 15:
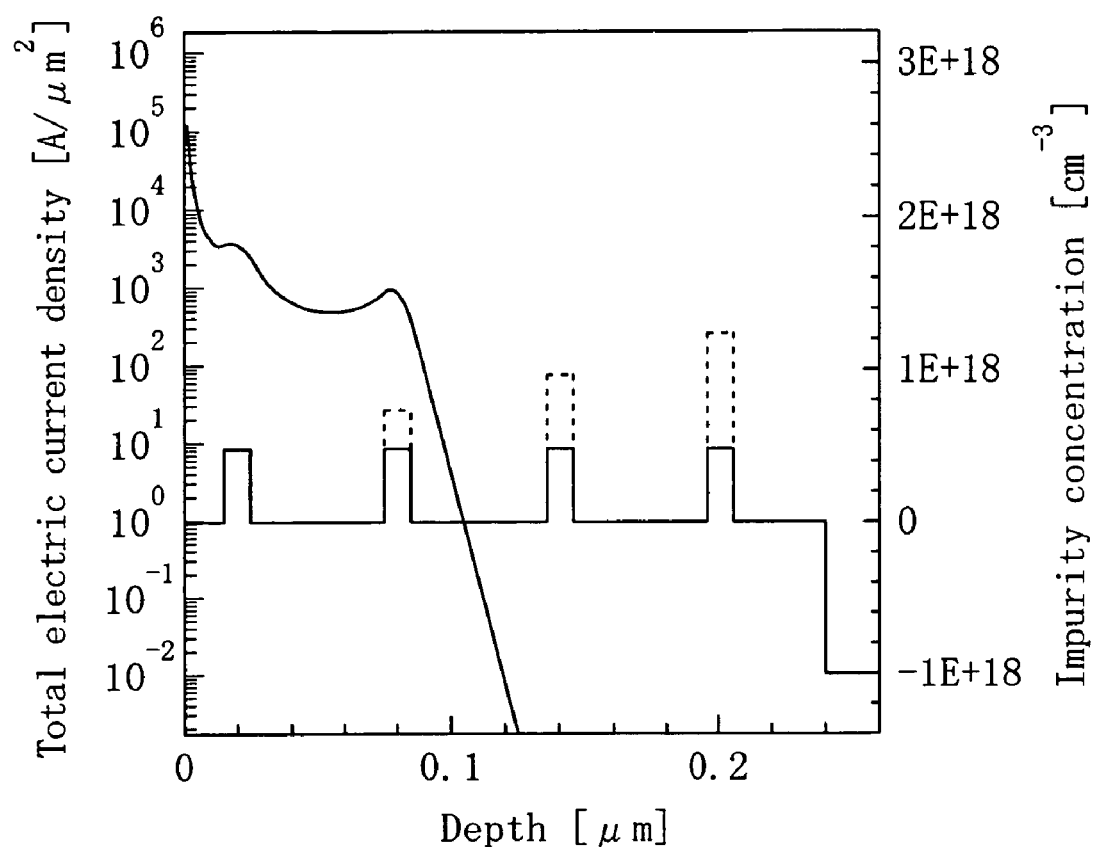
FIG. 15 is a graph showing results of simulating total electric current density in the depth direction for a region directly below the gate insulating film in the SiC-MISFET of the eighth embodiment.

FIG. 15 is a graph showing results of simulating total electric current density ($A/\mu m^2$) in the depth direction for a region directly below the gate insulating film in the SiC-MISFET of this embodiment. The simulation results shown in FIG. 15 were obtained when Vg−VT was fixed at a constant value. As shown in FIG. 15, in the current density distribution going perpendicularly from the surface of the channel layer 120 toward the interior thereof, current density in a region located at a depth of 5 nm or more is relatively high. The average current density in this deeper portion is greater than the average current density in a corresponding deeper portion of a MISFET that includes as a channel layer a second conductivity-type semiconductor layer having a uniform concentration, as will be shown in FIG. 17. Thus, interface traps resulting from defects in the gate insulating film are not likely to have an effect in the channel layer 120, thereby achieving the large current density. In addition, normally-off operation is obtained as will be described later. In other words, the modulation-doped channel layer 120 is structured in such a manner that the ratio between the average current density in the surface layer being a region located from the surface of the channel layer 120 to a depth d1 and the average current density in the deeper portion of the channel layer 120 being a region located at a depth beyond the depth d1, is lower than the ratio thereof obtained when the channel layer is replaced by the uniform-concentration second-conductivity-type semiconductor layer.

-Study of Conditions Necessary for Normally-Off Operation-

Hereinafter, the process how the present inventors found the conditions required for normally-off operation will be described Since interface traps seriously affect the electron transport mechanism in inversion MISFETs in which 4H—SiC is used, various studies have been made in order to increase the channel mobility of the MISFETs. Particularly, in accumulation channel MISFETs, raising channel mobility up to twice that of the inversion MISFETs has been successfully achieved.

Figure 17:
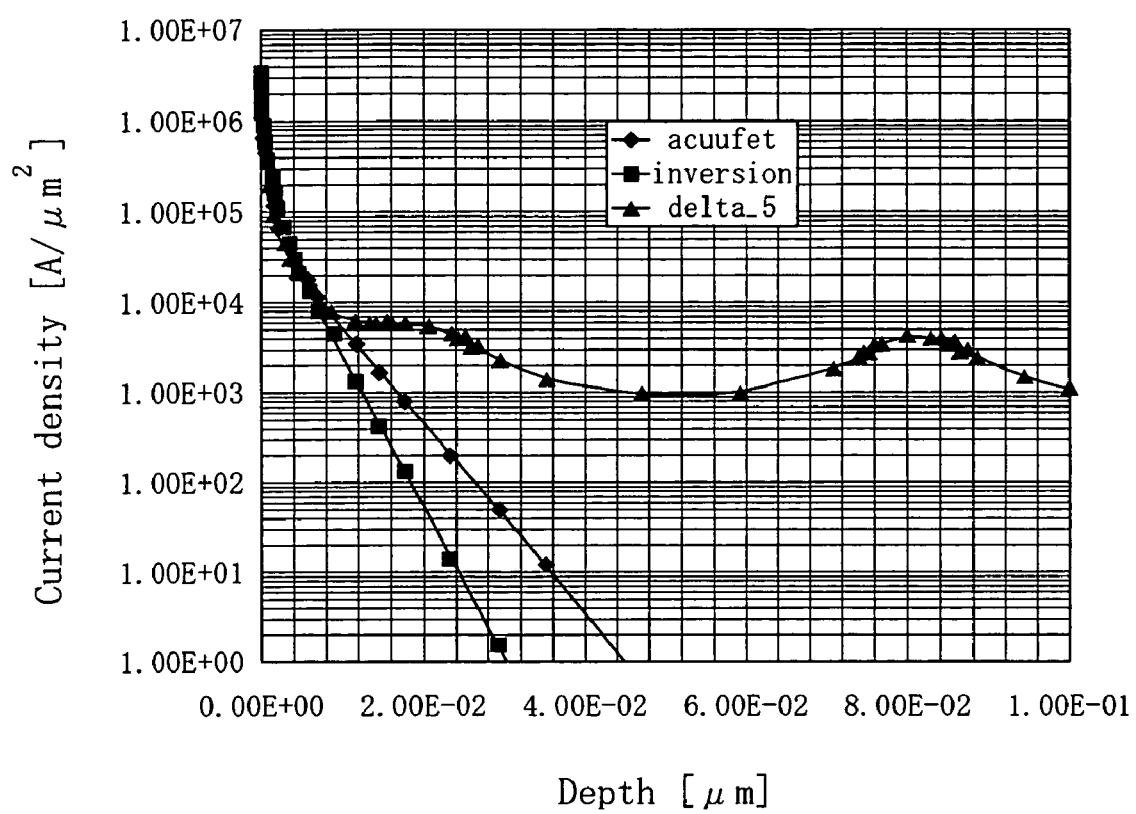
FIG. 17 is a graph showing results of simulating current density in the depth direction in an accumulation channel SiC-MISFET including a modulation-doped channel layer, in an inversion SiC-MISFET, and in an accumulation channel SiC-MISFET including a channel region that has a uniform concentration.

FIG. 17 is a graph showing results of simulating current density in the depth direction in an accumulation channel SiC-MISFET including a modulation-doped channel layer having five δ doped layers (indicated by solid triangles ▲), in a conventional inversion SiC-MISFET (indicated by solid squares ■), and in an accumulation channel SiC-MISFET including a channel region that is not modulation-doped but has a uniform dopant concentration of $1. \times 10^{16} \cdot cm^{-3}$ (indicated by solid circles). It should be noted that the data indicated by the solid triangles ▲ in FIG. 17 was obtained under conditions in which the δ doped layers and undoped layers included in the channel layer had the same impurity concentrations as those of the SiC MISFET of this embodiment, but that the impurity concentration of a p-type SiC layer, which is a region located below the channel layer, is $6.0 \times 10^{15} \cdot cm^3$.

As shown in FIG. 17, the inversion SiC-MISFET, the accumulation channel SiC-MISFET, and the accumulation channel SiC-MISFET with the modulated-doped channel layer all exhibit substantially the same current density distribution in a region (surface layer) located to a depth of about 5 nm. In a region (deeper portion) where the depth is beyond 5 nm, however, the accumulation channel MISFETs have larger currents than the inversion MISFET, which allows the current driving force of the accumulation channel MISFETs to be larger than that of the inversion MISFET.

Specifically, as shown in FIG. 17, the essential significance of the accumulation channel MISFETs is in their structure in which, in the depth-direction density distribution of current flowing in the channel, the ratio of the current flowing in the deeper portion of the channel region to the current flowing in the surface portion thereof is increased as compared with that in the inversion MISFET. This is not limited to SiC-MISFETs in which SiC is used, but is in common to general MISFETs such as Si-MISFETs. Nevertheless, despite having relatively higher channel mobility, conventionally structured ACCUFETs and other accumulation channel MISFETs have not yet had such current density as necessary for a power device probably because they cannot have sufficiently high channel mobility due to the influence of interface traps present at the MOS interface.

In contrast, as shown in FIG. 17, in the accumulation channel SiC-MISFET including the modulation-doped channel layer formed by alternately stacking the δ doped layers and undoped layers, the current density in the region located at a depth of 5 nm or more is significantly increased as compared with the accumulation channel SiC-MISFET that includes the uniformly doped channel region. That is, the modulation-doping of the channel layer presumably mitigates the effects of interface traps, such that an increase in the channel mobility can be achieved.

When the modulation-doped structure is employed for the channel region in the SiC-MISFET, the channel mobility can be raised. In accordance with simulation results, however, since the threshold voltage of the SiC-MISFET is −22 V, the SiC-MISFET is turned on to allow current flow with the gate voltage being 0 V. This makes it difficult to realize normally-off operation necessary for practical application of the power transistor. The present inventors therefore tried to change the threshold voltage by adjusting the p-type impurity concentration of the p-type SiC layer 110 that is the p-type region shown in FIG. 13.

Figures 18, 19:
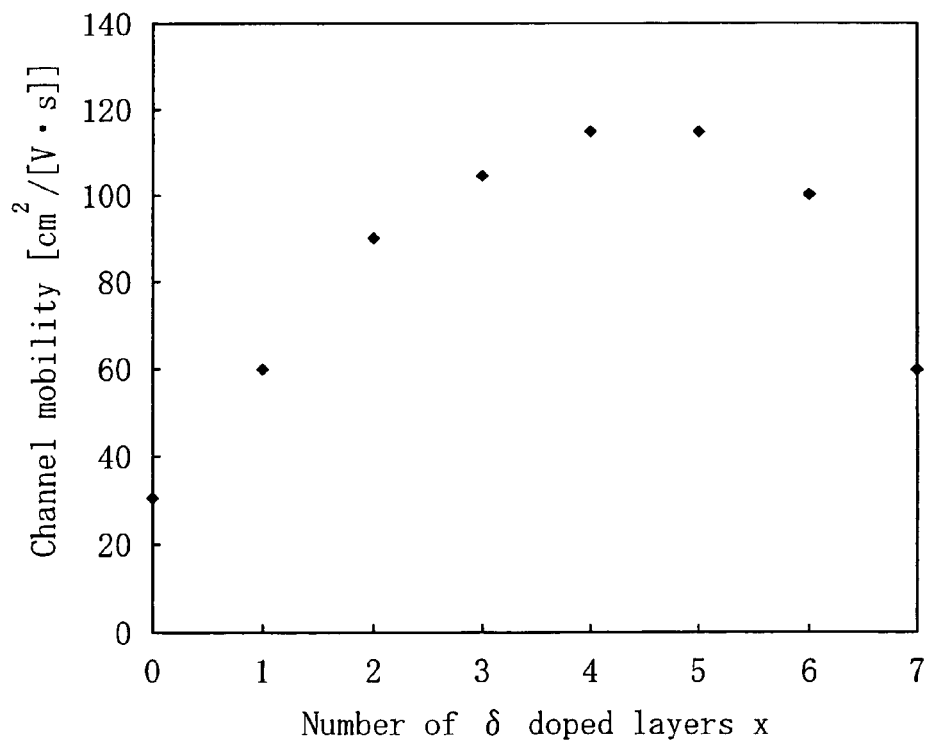
FIG. 18 is a table showing relationship between the number of δ doped layers and threshold voltage VT when the impurity concentration of a semiconductor region of a first conductivity type is at a given concentration.
FIG. 19 is a graph showing results of simulating relationship between the number of δ doped layers and channel mobility in a channel layer.

FIG. 18 is a table showing relationship between the number of δ doped layers and threshold voltage VT when the impurity concentration of the p-type region (p-type SiC layer) is $2 \times 10^{17} \cdot cm^{-3}$. In FIG. 18, DAC1, DAC2, DAC3, . . . respectively show SiC-MISFETs in which a channel layer includes one δ doped layer, two δ doped layers, and three δ doped layers, . . . The respective p-type regions of the accumulation channel SiC-MISFETs for which the data shown in FIG. 18 was obtained had an impurity concentration of $2 \times 10^{17} \cdot cm^{-3}$, which is about 30 times higher than the impurity concentration ($6.0 \times 10^{15} \cdot cm^{-3}$) of the p-type region of the accumulation channel SiC-MISFETs for which the data shown in FIG. 17 was obtained. As a result, when the number of the δ doped layers is five, the threshold voltage VT increases to −8 V. This means that the threshold voltage VT of the accumulation channel SiC-MISFET having the modulation-doped channel layer can be increased by raising the p-type impurity concentration of the p-type region.

However, even in that case, normally-off operation cannot be realized so long as the threshold voltage is a negative value. The present inventors then noted that as the number of the δ doped layers became fewer, the threshold voltage increased in the data shown in FIG. 18. Specifically, if the p-type impurity concentration of the p-type region is increased while lowering the number of the δ doped layers included in the channel layer, then the threshold voltage VT should be able to be controlled to be 0 or a positive value. However, if the lowered number of the δ doped layers leads to a small channel mobility, current density required for a power device cannot be obtained. It is thus necessary to control the threshold voltage to be 0 or positive while maintaining the channel mobility at a high level.

Figure 16:
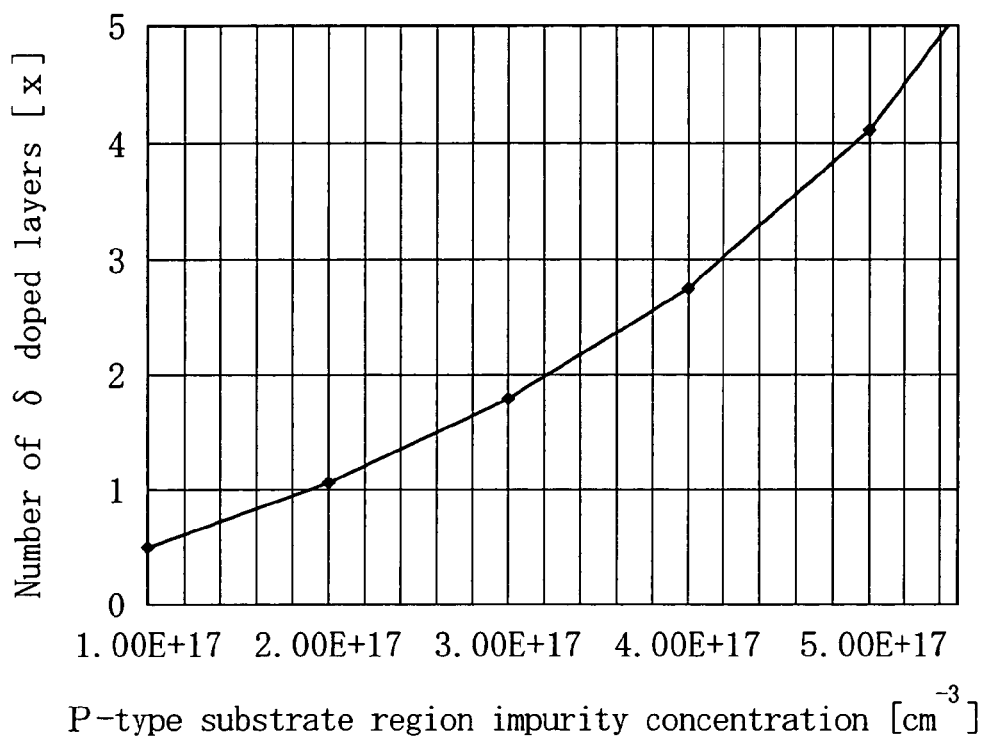
FIG. 16 is a graph indicating the relationship between the number of δ doped layers and the p-type impurity concentration of a p-type region, necessary to satisfy conditions for normally-off operation.

FIG. 16 is a graph showing the relationship between the number of δ doped layers and the p-type impurity concentration of a p-type region, necessary to satisfy the conditions for normally-off operation. In the simulations, each δ doped layer in the channel layer has a thickness of 10 nm and an n-type impurity concentration of $1 \times 10^{18} \cdot cm^{-3}$, while each undoped layer in the channel layer has a thickness of 40 nm and an n-type impurity concentration of $1 \times 10^{16} \cdot cm^{-3}$. As shown in FIG. 16, as the number of the δ doped layers is increased, normally-off operation cannot be obtained unless the p-type impurity concentration of the p-type region is increased.

FIG. 19 is a graph showing results of simulating relationship between the number of δ doped layers included in a channel layer and channel mobility in devices, in each of which employed are the number of δ doped layers and the p-type-region concentration that would be adopted for the optimum design of a normally-off semiconductor device of the present invention. As shown in FIG. 19, when the number of the δ doped layers is one or two, the channel mobility is low and a sufficiently high current density thus cannot be obtained. On the other hand, when the number of the δ doped layers is five, the channel mobility obtained is substantially the same as that when the number of the δ doped layers is four. In the case of six or more δ doped layers, the channel mobility on the contrary decreases. This means that for the number of the δ doped layers, there exists an appropriate range which allows the channel mobility to be the largest.

-Conditions for Obtaining Normally-Off Operation in a Power Device-

In accordance with a summary of the above-mentioned simulation results, the conditions for obtaining normally-off operation while keeping the functions as a power device are as follows. The above-mentioned simulations were all performed for the accumulation channel SiC-MISFETs that had the channel layer of the multiple δ doped layer formed by alternately stacking the δ doped layers and undoped layers. Generally, however, accumulation channel MISFETs in which semiconductor material other than SiC is used exhibit characteristics showing the same tendency as that of the above-mentioned characteristics. The modulation-doped channel layer does not necessarily have a structure in which δ doped layers (high-concentration doped layers) and undoped layers (low-concentration doped layers) are alternately stacked. Further, the channel layer does not have to be formed of only n-type semiconductor layers or p-type semiconductor layers, but there may be both n-type and p-type semiconductor layers in the channel layer. It should be however noted that the channel layer has to be, on average or as a whole, of a conductivity type opposite to a p-type region.

As a precondition, the accumulation channel MISFET of the present invention therefore has a structure that includes a first-conductivity-type (p-type) region (the p-type SiC layer 110 in FIG. 13) and a channel layer that is formed on the p-type region, is of a second conductivity type (n-type) on average, and is modulation-doped so as to exhibit a non-uniform impurity concentration distribution. Based on this premise, conditions for realizing high channel mobility and normally-off operation will be described.

First, as can be seen from FIG. 17, the inversion MISFET and the accumulation channel MISFETs exhibit the same current-density profile before the depth d1 (a depth of 5 nm in FIG. 5) is reached. Thus, if the ratio between the amount of current flowing in the region located to the depth d1 and the amount of current flowing in the region located deeper than the depth d1 is lower than that in the accumulation channel MISFET including the uniformly doped channel layer, then the effects of interface traps can be avoided such that a large amount of current can be obtained.

Now, assume that the first-conductivity-type semiconductor region is a p-type region, the modulation-doped channel layer is an n-type channel, the p-type impurity concentration of the p-type region is Np+, and the average n-type impurity concentration of the n-type channel layer is NaV. In the case of a channel layer formed by alternately stacking δ doped layers and undoped layers, NaV will be the average impurity concentration of the entire channel layer. From the relationship between the number of the δ doped layers and the p-type-region impurity concentration shown in FIG. 4, it is found that when the absolute value of the average second-conductivity-type impurity concentration of the channel layer is high, the first-conductivity-type impurity concentration of the first-conductivity-type semiconductor region has to be increased in accordance therewith in order to obtain normally-off operation.

Any number of possible methods for realizing modulation-doping profiles that satisfy the above condition are available. As a device-designing guidepost, however, the impurity concentrations of the channel layer and the p-type region in a MISFET are adjusted so that, in the current flowing immediately below the gate insulating film, the ratio between average current density in the region (surface layer) of the channel layer located from the surface of the channel layer to a depth d1 and average current density in the region (deeper portion) of the channel layer located below the depth d1 is made low when the channel is in its "on" state, that is, when Vg-VT is fixed at a positive value. Then, interface traps are not likely to have an effect and a high channel mobility can thus be achieved. In other words, a high channel mobility can be obtained, if the ratio between the current density in the surface layer and the current density in the deeper portion is made lower than that in the case of a channel layer having a uniform impurity concentration distribution. In this case, the depth d1 is the depth of the region in which the inversion MISFET and the accumulation channel MISFETs shown in FIG. 17 exhibit the same current density when the accumulation channel MISFETs are in their "on" state. The depth d1 is 5 nm in the above-described embodiment.

For example, in the case of a channel layer in which n-type semiconductor layers account for most part thereof and the uppermost layer that is in contact with a gate insulating film is a thin p-type semiconductor layer, channel current flows in the deeper portion of the channel layer, thereby allowing the channel mobility to increase.

Assume that a channel layer formed by alternately stacking δ doped layers (high-concentration doped layers) and undoped layers (low-concentration doped layers) is provided as a channel layer which is modulation-doped so that VT (threshold voltage) is most easily controlled. The number of repetitions of the δ doped layers and undoped layers in the channel layer is m (m is an integer), the thickness of each undoped layer is Ls (nm), and the impurity concentration of the undoped layer is Nn⁻ (/cm³). And, the thickness of each δ doped layer is represented by half breadth Lδ (nm) and the impurity concentration of the δ doped layer is Nn⁺ (/cm³). It should be noted that the impurity concentration of the undoped layers (low-concentration doped layers) is not more than one-tenth of the impurity concentration of the δ doped layers (high-concentration layers). In this case, if each parameter is established so that the following equation (8)

$$(Ls \times Nn^- + L\delta \times Nn^+ \times m)/(Ls + L\delta \times m) \leq Np^+ \qquad (8)$$

holds, a normally-off MISFET can be easily realized.

FIG. 16 therefore shows the relationship between the number of the δ doped layers and the p-type impurity concentration of the p-type region when $L\delta=10$, $Ls=40$, $Nn^-=1\times10^{16}\cdot cm^{-3}$, and $Nn^+=1\times10^{18}\cdot cm^{-3}$. As can be seen from FIG. 16, when the p-type impurity concentration of the p-type region is $2\times10^{17}\cdot cm^{-3}$, the number of the δ doped layers has to be one in order to satisfy the normally-off conditions. However, when the p-type impurity concentration of the p-type region is $1\times10^{18}\cdot cm^{-3}$, the normally-off conditions can be easily satisfied even if the number of the δ doped layers is four or five.

On the other hand, when the p-type impurity concentration of the p-type region is made high, the threshold voltage VT can be raised. However, if the ratio between current density in the region (surface layer) located from the surface of the channel layer to the depth d1 and current density in the region located below the depth d1 when the accumulation channel MISFET is in its "on" state becomes too high, the channel mobility decreases. Specifically, as can be seen from FIG. 15, increasing the number of the δ doped layers only results in an increase in the number of useless δ doped layers, such that the current flowing in the deeper portion decreases and the channel mobility is instead reduced as shown in FIG. 19.

As indicated by the broken lines in FIG. 15, when the impurity concentration of each δ doped layer included in the multiple δ doped layer is graded to increase going toward the deeper portion, the electric field effected in the deeper portion is large, while the electric field effected in the surface portion is always small. As in the first embodiment, for example, the current density in the surface region of the channel layer can thus be increased further.

Other Embodiment

In the above-described simulations and embodiments, described are the cases in which the first-conductivity-type semiconductor region is a p-type region and the modulation-doped channel layer is formed of only n-type semiconductor layers on average. However, the accumulation channel MISFETs of the present invention may include an n-type region and a modulation-doped channel layer formed of p-type semiconductor layers on average. In that case, the source/drain layer will be a p-type semiconductor layer.

Further, although the example in which the present invention is applied in a planar MISFET has been described in this embodiment, the same effects as obtained in this embodiment are exhibited when the present invention is applied in a vertical power MISFET in which a drain electrode is provided on the bottom face of a substrate.

The structures of the accumulation channel MISFETs of the present invention is particularly effective for an accumulation channel MISFET in which a wide bandgap semiconductor, typified by silicon carbide, for example, is used.

The wide bandgap semiconductors to which the present invention is applicable include semiconductors that have a wider bandgap than Si, such as GAN, AlGaN, AlN, GaAs, and AlGaAs, in addition to SiC, and any of such wide bandgap semiconductors may be used.

INDUSTRIAL APPLICABILITY

The semiconductor devices of the present invention may be used for devices such as accumulation channel MISFETs, ACCUFETs, and vertical MISFETs incorporated in electronic equipment, and in particular may be used for devices handling high-frequency signals, and power devices.

The invention claimed is:

1. A semiconductor device comprising:
a semiconductor substrate;
a semiconductor region of a first conductivity type formed in at least a part of the semiconductor substrate;
a modulation-doped channel layer formed on the first-conductivity-type semiconductor region, having a non-uniform impurity concentration distribution, and being of a second conductivity type;
a gate insulating film formed on the channel layer;
a gate electrode formed on the gate insulating film; and
a source layer of the second conductivity type formed in the first-conductivity-type semiconductor region so as to be located laterally with respect to the gate electrode,
wherein given that y is depth into the channel layer from the surface thereof; N(y), a function of the depth y, is the impurity concentration of the channel layer in the depth direction; $N_{cm}$ is the average impurity concentration of the channel layer; and yc, which is the depth of the center of gravity of the impurity concentration distribution in the depth direction in the channel layer, is given by the following equation:

$yc = |\{\int N(y) \cdot y \cdot dy\}/N_{cm}|$, then the channel layer is configured to satisfy the following equation:

$yc \geq T_{ch}/2$ where $T_{ch}$ is the thickness of the entire channel layer.

2. The semiconductor device of claim 1, characterized in that the semiconductor substrate is an SiC substrate.

3. The semiconductor device of claim 1, characterized in that the channel layer is configured to be pinched off by a depletion layer that extends from the gate insulating film and a depletion layer that extends from the first-conductivity-type semiconductor region when the potential of the gate electrode is about 0 V.

4. The semiconductor device of claim 3, characterized in that the thickness $T_{ch}$ of the channel layer satisfies the following equation:

$T_{ch} \leq \sqrt{[(2\varepsilon s/q)\{(N_{cm}+N_{bs})/(N_{cm} \cdot N_{bs})\} \cdot V_{bl}]} +$
$\sqrt{[(2\varepsilon s/q)(1/(N_{cm})\{\phi_{ms}-(Q/C_{ox})\}]}$ where $|N_{bs}|$ is the absolute value of first-conductivity-type impurity concentration of the first-conductivity-type semiconductor region; $|N_{cm}|$ is the absolute value of the average impurity concentration of the channel layer; $\varepsilon s$ is the vacuum dielectric constant; q is the elementary charge; $\phi_{ms}$ is the surface potential of the channel layer; Q is electric charge in the gate insulating film; $C_{ox}$ is the capacitance of the gate insulating film; and $V_{bl}$ is difference in internal potential between the channel layer and the first-conductivity-type semiconductor layer.

5. The semiconductor device of claim 4, characterized in that the absolute value $|N_{bs}|$ of the first-conductivity-type impurity concentration of the first-conductivity-type semiconductor region is higher than the absolute value $|N_{cm}|$ of the average second-conductivity-type impurity concentration of the channel layer.

6. The semiconductor device of claim 4 or 5, characterized in that the channel layer includes a high-concentration doped layer and a low-concentration doped layer, wherein the high-concentration doped layer contains an impurity of the second conductivity type, and the low-concentration doped layer is of the second conductivity type and has an impurity concentration not more than one-tenth of the peak concentration of the high-concentration doped layer.

7. The semiconductor device of claim 6, characterized in that the high-concentration doped layer is a δ doped layer formed below a mid-position of the channel layer.

8. The semiconductor device of claim 7, characterized in that the thickness of the δ doped layer is not more than 10 nm.

9. The semiconductor device of claim 7, characterized in that the first-conductivity-type impurity concentration of the first-conductivity-type semiconductor region is high to a degree at which the δ doped layer is depleted to a foot area of its concentration profile which has a low impurity concentration and is located alongside the gate electrode.

10. The semiconductor device of claim 7, characterized in that the distance from an edge of the δ doped layer, which is located alongside the first-conductivity-type semiconductor region, to the first-conductivity-type semiconductor region is 20 nm or less.

11. The semiconductor device of claim 7, characterized in that when a voltage of about 0 V is applied to the gate electrode, the depletion layer that extends from the gate electrode side and the depletion layer that extends from the first-conductivity-type semiconductor region make contact with each other in a foot area of a concentration profile for the δ doped layer, such that pinch-off is caused in the channel layer, the foot area having a low impurity concentration and located alongside the gate electrode.

12. The semiconductor device of claim 11, characterized in that the impurity concentration of the foot area, being the pinch-off point, is not less than the impurity concentration of the low-concentration doped layer and not more than the peak concentration of the δ doped layer.

13. The semiconductor device of claim 11, characterized in that when a voltage from about 0 V going to where the channel goes on is applied to the gate electrode, opening of the channel takes place in such a manner that the depletion layer that extends from the first-conductivity-type semiconductor region begins to expand from the foot area, being the pinch-off point, of the δ doped layer so as to extend to the interface between the channel layer and the gate insulating film.

14. The semiconductor device of claim 6, characterized in that the high-concentration doped layer is a deep-portion δ doped layer formed below a mid-position of the channel layer, and
the semiconductor device further includes a surface-portion δ doped layer formed above the mid-position of the channel layer.

15. The semiconductor device of claim 14, characterized in that the impurity concentration of the surface-portion δ doped layer is lower than that of the deep-portion δ doped layer.

16. The semiconductor device of claim 6, characterized in that the high-concentration doped layer is a graded doped layer in which impurity concentration decreases going from its lower part to its upper part.

17. The semiconductor device of claim 16, characterized in that when a voltage of about 0 V is applied to the gate electrode, the depletion layer that extends from the gate electrode side and the depletion layer that extends from the first-conductivity-type semiconductor region make contact with each other in a graded region of an impurity concentration profile for the graded doped layer, such that pinch-off is caused in the channel layer.

18. The semiconductor device of claim 6, characterized in that the high-concentration doped layer is a uniformly doped layer that is formed in contact with the first-conductivity-type semiconductor region and has a substantially uniform impurity concentration.

19. The semiconductor device of claim 18, characterized in that the uniformly doped layer stops the depletion layer that extends from the first-conductivity-type semiconductor region so that the pinch-off point is stabilized in a substantially constant location.

20. The semiconductor device of claim 19, characterized in that the impurity concentration of the uniformly doped layer is not less than that of the first-conductivity-type semiconductor region.

21. The semiconductor device of claim 19, characterized in that where $N_s$ is the impurity concentration of the uniformly doped layer, the thickness $T_{ds}$ of the uniformly doped layer satisfies the following equation:

$$T_{ds} \geq \{N_{bs}/(N_s + N_{bs})\} \times \sqrt{[(2\varepsilon s/q) \cdot \{(N_s + N_{bs})/(N_s \cdot N_{bs})\} \cdot V_{bi}]}.$$

22. The semiconductor device of claim 19, characterized in that where $N_{ud}$ is the impurity concentration of the low-concentration doped layer in the channel layer, the thickness $T_{ud}$ of the low-concentration doped layer satisfies the following equation:

$$T_{ud} \leq \sqrt{[(2\varepsilon s/q)(1/N_{ud})\{\phi_{ms}-(Q/C_{ox})\}]}.$$

23. The semiconductor device of claim 22, characterized in that the thickness $T_{ud}+T_{ds}$ of the entire channel layer satisfies the following equation:

$$T_{ud} + T_{ds} \leq \sqrt{[(2\varepsilon s/q) \cdot \{(N_s + N_{bs})/(N_s \cdot N_{bs})\} \cdot V_{bi}]} + \sqrt{[(2\varepsilon s/q)(1/(N_{ud})\{\phi_{ms} - (Q/C_{ox})\}]}.$$

24. The semiconductor device of any one of claims 19 through 23, characterized in that when a voltage of about 0 is applied to the gate electrode, the depletion layer that extends from the gate insulating film side and the depletion layer that extends from the first-conductivity-type semiconductor region side come into contact with each other and cause pinch-off in an impurity-concentration-profile region of transition from the uniformly doped layer to the low-concentration doped layer.

25. The semiconductor device of any one of claims 4 through 24, characterized in that where Vg is a voltage applied to the gate electrode and Vt is the threshold voltage, if the absolute value of Vg–Vt is within a range of not less than 0 V and not more than 5 V, current flowing in a region of the channel layer which is located below the mid-position thereof is larger than current flowing in a region of the channel layer which is located above the mid-position.

26. The semiconductor device of any one of claims 1 through 25, characterized by further comprising a drain layer formed by doping a lower portion of the semiconductor substrate with a high concentration of an impurity of the second conductivity type, wherein the semiconductor device functions as a vertical MISFET.

* * * * *

UNITED STATES PATENT AND TRADEMARK OFFICE
CERTIFICATE OF CORRECTION

PATENT NO.        : 6,995,397 B2                                    Page 1 of 1
APPLICATION NO.   : 10/466353
DATED             : February 07, 2006
INVENTOR(S)       : Kenya Yamashita et al.

It is certified that error appears in the above-identified patent and that said Letters Patent is hereby corrected as shown below:

On the title page item (75) Inventer, change:

"Kenya Yamashita, Kadoma (JP)" to -- Kenya Yamashita, Osaka (JP) --
"Kunimasa Takahashi, Ibaraki (JP)" to --Kunimasa Takahashi, Osaka (JP) --
"Masao Uchida, Ibaraki (JP) " to -- Masao Uchida, Osaka (JP) --

Signed and Sealed this

Ninth Day of January, 2007

JON W. DUDAS
*Director of the United States Patent and Trademark Office*